(12) United States Patent
Perego et al.

(10) Patent No.: US 9,286,965 B2
(45) Date of Patent: Mar. 15, 2016

(54) MEMORY REFRESH METHOD AND DEVICES

(75) Inventors: Richard Perego, Thornton, CO (US); Thomas Vogelsang, Mountain View, CA (US); John Brooks, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 249 days.

(21) Appl. No.: 13/990,363

(22) PCT Filed: Nov. 11, 2011

(86) PCT No.: PCT/US2011/060458
§ 371 (c)(1),
(2), (4) Date: May 29, 2013

(87) PCT Pub. No.: WO2012/074724
PCT Pub. Date: Jun. 7, 2012

(65) Prior Publication Data
US 2013/0254475 A1    Sep. 26, 2013

Related U.S. Application Data

(60) Provisional application No. 61/419,672, filed on Dec. 3, 2010.

(51) Int. Cl.
*G11C 11/406* (2006.01)
(52) U.S. Cl.
CPC .... *G11C 11/40618* (2013.01); *G11C 11/40603* (2013.01); *G11C 11/40611* (2013.01); *G11C 2211/4061* (2013.01)
(58) Field of Classification Search
CPC .................. G11C 11/40603; G11C 11/40611; G11C 11/40618; G11C 2211/4061

USPC ........................................................ 711/106
See application file for complete search history.

(56) References Cited

U.S. PATENT DOCUMENTS

| | | | |
|---|---|---|---|
| 5,963,497 A * | 10/1999 | Holland | 365/222 |
| 6,195,303 B1 * | 2/2001 | Zheng | 365/222 |
| 6,278,648 B1 * | 8/2001 | Cowles et al. | 365/230.03 |
| 6,697,909 B1 * | 2/2004 | Wang et al. | 711/106 |
| 6,941,415 B1 * | 9/2005 | Ryan | 711/106 |
| 7,043,599 B1 | 5/2006 | Ware et al. | |
| 7,174,418 B2 | 2/2007 | Hong et al. | |

(Continued)

FOREIGN PATENT DOCUMENTS

| | | |
|---|---|---|
| JP | 2006-269029 | 10/2006 |
| JP | 2006-269029 A | 10/2006 |

OTHER PUBLICATIONS

PCT International Search Report and Written Opinion, PCT/US2011/060458, May 18, 2012, 8 Pages.

(Continued)

*Primary Examiner* — Hal Schnee
*Assistant Examiner* — Ramon A Mercado
(74) *Attorney, Agent, or Firm* — Fenwick & West LLP

(57) ABSTRACT

The present disclosure describes DRAM architectures and refresh controllers that allow for scheduling of an opportunistic refresh of a DRAM device concurrently with normal row activate command directed toward the DRAM device. Each activate command affords an "opportunity" to refresh another independent row (i.e., a wordline) within a memory device with no scheduling conflict.

17 Claims, 18 Drawing Sheets

(56) References Cited

U.S. PATENT DOCUMENTS

| | | |
|---|---|---|
| 7,551,505 B1 | 6/2009 | Daniel |
| 7,565,479 B2 | 7/2009 | Best et al. |
| 7,565,480 B2 | 7/2009 | Ware et al. |
| 7,590,021 B2 | 9/2009 | Michalak et al. |
| 2003/0081483 A1* | 5/2003 | De Paor et al. ............... 365/222 |
| 2004/0047221 A1* | 3/2004 | Tanaka ........................ 365/222 |
| 2005/0157577 A1* | 7/2005 | Barth et al. ............. 365/230.03 |
| 2006/0039227 A1* | 2/2006 | Lai et al. ................ 365/230.03 |
| 2007/0195627 A1* | 8/2007 | Kim ............................. 365/222 |
| 2008/0168217 A1 | 7/2008 | Vogelsang |
| 2009/0067260 A1 | 3/2009 | Yang et al. |
| 2009/0083479 A1 | 3/2009 | Lee et al. |
| 2010/0080075 A1 | 4/2010 | Kunce et al. |
| 2011/0141836 A1* | 6/2011 | Luthra et al. .................. 365/222 |

OTHER PUBLICATIONS

Ghosh, Mrinmoy and Lee, Hsien-Hsin, Smart Refresh: An Enhanced Memory Controller Design for Reducing Energy in Conventional and 3D Die-Stacked DRAMs, School of Electrical and Computer Engineering, Georgia Institute of Technology, Atlanta, Georgia, Dec. 2007. 12 Pages.

International Search Report and Written Opinion dated May 18, 2012 for International Application No. PCT/US2011/060458. 8 pages.

\* cited by examiner

MEMORY REFRESH METHOD AND DEVICES

BACKGROUND

The present disclosure relates to methods and apparatuses, including memory devices and integrated circuit devices that control such memory devices, including methods and apparatuses supporting a protocol for refreshing memory devices.

In dynamic random access memories (DRAMs), the memory cells store data as a charge on a storage capacitor, which leaks away over time. Thus, the memory cells must be refreshed periodically to avoid data loss. The issuance and execution of refresh commands consumes power and may degrade performance, for example, when memory cells are refreshed unnecessarily and the refresh commands are scheduled in an inefficient manner.

BRIEF DESCRIPTION OF THE DRAWINGS

The teachings of the embodiments of the present disclosure can be readily understood by considering the following detailed description in conjunction with the accompanying drawings.

DETAILED DESCRIPTION OF EMBODIMENTS

Figure 1A:
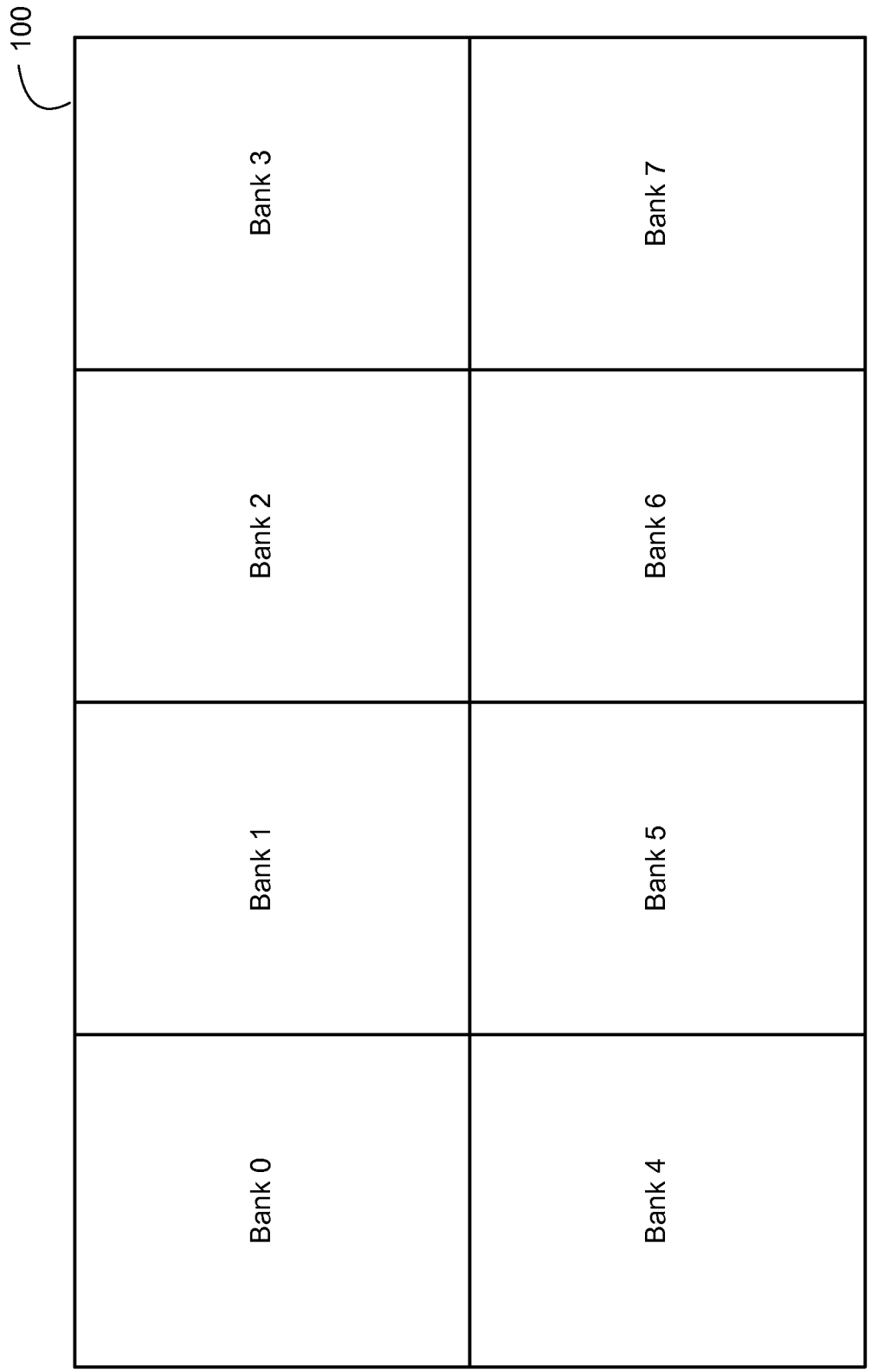
FIG. 1A illustrates a memory device comprising a plurality of memory banks, according to one embodiment.

The present disclosure describes various embodiments of dynamic random memory devices ("DRAMs"), memory controllers that control such devices, and system architectures that allow for concurrent row activation and refresh of a DRAM bank (or bank region). Generally, in various embodiments, an activate command transmitted by the memory controller, which opens a row in the specified bank for subsequent column read or write access, effectuates an "opportunity" to refresh a separate row within that memory bank of the memory device (e.g., as is described in more detailed embodiments below).

In various embodiments, memory devices and controllers are described which allow for more frequent memory refresh operations without incurring significant performance or power penalties. As a result, the DRAM memory cell of the memory devices described herein may include smaller capacitors (relative to DRAMs that refresh less frequently), thereby reducing the size (and cost) of the DRAM die.

In one embodiment, a DRAM bank generally refers to an independently addressable memory array resource of the memory device, where multiple banks allow interleaving of column access operations (e.g., read and write operations) between activated rows of respective banks. Throughout this description such a bank is referred to as a "logical bank" and is identified by a logical bank address. Sensing of a row in a logical bank is conducted based on an activate command, a corresponding row address, and at the very least, a bank address that identifies the bank where the intended row is sensed. A logical bank may be physically configured using multiple sub-arrays of memory cells, each sub-array having an associated row of sense amplifiers (or shared sense amplifiers with other sub-arrays) that sense data during the row activation (or refresh) operation. Banks within a DRAM memory device may also be grouped as bank groups where a bank address is used to select the bank group and one or more address bits are used to select a bank within the bank group.

In an embodiment, an opportunistic refresh is considered to be a refresh of a first row of a logical memory bank in the memory device that is performed in response to an activate command, where the activate command specifies activation of a second row of memory cells in the same logical memory bank. That is, the activate command provided by the memory controller results in both a refresh of the specified row of the logical memory bank in the memory device as well as activation of another row in the same logical memory bank.

In an embodiment, a memory controller is at least one integrated circuit device that includes circuitry to (control or) schedule refresh operations in a memory device as is described in accordance with the various protocols described below. In one embodiment, the memory controller schedules refresh operations such that the issuance of unnecessary refreshes by the memory controller is avoided. In such an embodiment, the memory controller schedules opportunistic refreshes only for rows that are valid. That is, refresh is only performed on rows in the memory device that contain valid data. Thus, the memory controller schedules refresh operations such that refreshing invalid rows is skipped. Because these rows do not contain any valid data, any opportunistic refresh performed on the invalid rows results in unwanted power consumption. Additionally, refresh operations are skipped in rows that are intrinsically refreshed due to recent row activation operations performed on these rows that result in the accessed rows being recharged.

Referring now to FIG. 1A, there is shown an embodiment of a memory device 100, which comprises a plurality of logical memory banks. In the example illustrated in FIG. 1A, memory device 100 comprises eight memory banks, Bank 0 through Bank 7. However, note that in other embodiments, memory device 100 may include a different total number of logical memory banks. The physical arrangement of the memory banks may also vary in alternate embodiments.

Figure 1B:
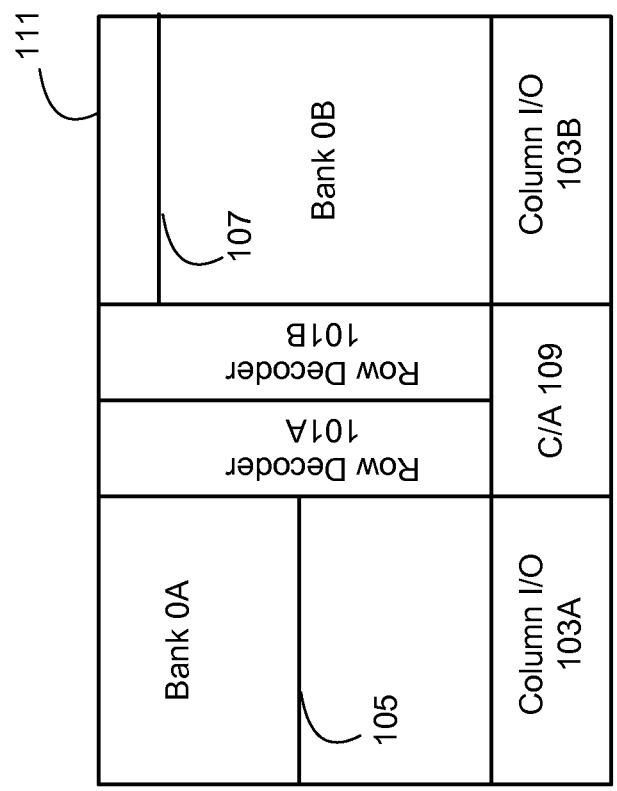
FIG. 1B illustrates a memory bank (from the memory device) comprising two memory regions, according to one embodiment.

Referring now to FIG. 1B, there is shown an embodiment of a memory bank 111 of memory device 100. Specifically, FIG. 1B illustrates an exemplary memory bank, (e.g., memory bank 0) of memory device 100. In one embodiment, Memory Bank 0 comprises a first memory region (Bank 0A) and a second memory region (Bank 0B) where each region comprises a two-dimensional array of storage cells that are organized as rows and columns. Memory Bank 0 may be a single or a plurality of physical memory banks that is addressed by a memory controller using a unique bank address. In addition, Bank 0A and Bank 0B may respectively represent a first sub-bank and a second sub-bank of the single physical bank represented by Memory Bank 0 according to one embodiment. In an embodiment, sub-banks of a single physical bank share common circuitry, which may make operations in one sub-bank dependent on the state and operation in the other sub-bank, for example in the configuration where adjacent sub-banks are coupled to a common row of sense amplifiers.

Because Memory Bank 0 is physically divided into a first and second memory region, a wordline in each memory region may be considered a sub-wordline, i.e., a portion of a full wordline. For the case where a sub-wordline is half the size of a normal wordline, memory device 100 utilizes half-page activation to activate a sub-wordline in each memory region.

As shown in FIG. 1B, Bank 0A includes row decoder 101A and column I/O 103A. Similarly, Bank 0B includes row decoder 101B and column I/O 103B. In one embodiment, an activate command is received by the memory device, from a memory controller. In response to the activate command, a row in Bank 0A of the memory device is sensed as identified by a row address associated with the activate command, and a refresh operation is concurrently effectuated in Bank 0B on a row as selected by another address (for example, the other address may be generated from a register in command/address (C/A) block 109, or may originate from the memory controller, as is described in more detail below). In this example, the amount of power consumed by sense operations for the activate and refresh operations is approximately the same as would be consumed by a normal activate for a wordline having twice the length (or a page size twice the size) of a given wordline in Memory Bank 0.

Because refresh operations do not require the use of the column I/O path (103A and 103B), only the bank row activated in response to the activate command will subsequently be accessed using it's associated column I/O path (103A or 103B) during the execution of a data access command (e.g., read or write). Thus, according to the embodiment shown in FIG. 1B, each column I/O path (103A or 103B) provides the full core bandwidth of a logical bank (Bank 0). Note that column I/Os 103A and 103B support full bandwidth because memory bank 111 is divided vertically rather than horizontally (according to the orientation of the elements in FIG. 1B).

As mentioned above, Memory Bank 0 may also include associated circuitry to generate internal refresh control signals that perform opportunistic and scheduled refresh operations according to one embodiment. In an embodiment, command/address (C/A) block 109 provides internal activate and precharge control signals (and address signals, as applicable) to row decoders 101A and 101B and column control signals, as applicable, to column I/Os 103A and 103B.

To illustrate an example refresh operation in the embodiment shown in FIG. 1B, consider an activate command issued by a memory controller to row 105 in Bank 0A. A command interface of the memory device receives the activate command and in response, row 105 is activated in Bank 0A. Specifically, responsive to the activate command, C/A block 109 provides an internal activate control signal and a row address based on the activate command to row decoder 101A. Row decoder 101A decodes the row address provided by C/A block 109 to determine which wordline to activate in Bank 0A. In this example, row decoder 101A activates row 105. After the internal activate control signal has been issued and the appropriate timing constraints have been met, C/A block 109 issues an internal data access control signal (read or write) to column I/O 103A that is directed to the addressed subset (i.e., column) of row 105. The internal data access control signal is provided by C/A block 109 responsive to the command interface receiving a data access command from the memory controller. Column I/O 103A determines which column(s) in Bank 0A need to be accessed based on the column address signal provided by C/A block 109. Once all data access signals associated with row 105 have been issued and the appropriate timing constraints have been satisfied, C/A block 109 will issue a precharge control signal to precharge row 105. The precharge control signal is issued responsive to a precharge command being received by the command interface of the memory device. In other embodiments, the precharge control signal could be driven in response to a timeout condition which occurs several cycles after a read or write command to Bank 0A.

In one embodiment, the activate command directed to Bank 0A also causes an opportunistic refresh to occur in Bank 0B. In this example, substantially simultaneous (i.e., concurrent) with the activate command directed to Bank 0A, the command interface receives a refresh activate command directed to Bank 0B. In one embodiment, a refresh activate command is an activate command associated with an opportunistic refresh. Responsive to the refresh activate command, C/A block 109 issues a refresh activate control signal to row decoder 101B. Row decoder 101B decodes the row address associated with the refresh activate control signal and drives the addressed wordline. In this example, row 107 of Bank 0B is opened. The process of activating a row involves sensing data from the storage cells associated with the activated wordline using local sense amplifiers. The activation of the row essentially refreshes the contents of the DRAM cells in that row. The timing parameter $t_{RAS,MIN}$ defines the amount of time from the receipt of an activate command to the contents of an associated row being latched by the sense amplifiers. Once this timing parameter has been satisfied, the row may be precharged. The command interface then receives a precharge command and C/A block 109 issues a corresponding precharge control signal to row 107, completing the opportunistic refresh operation. Thus, row 107 in Bank 0B is refreshed as a result of an activate command being directed to row 105 of Bank 0A.

By using half-page activation to activate a first wordline in a first memory region for a normal access, while concurrently activating a second wordline in a second memory region for an opportunistic refresh, the power consumption is not degraded relative to a design which uses full-page activation for a normal access and no opportunistic refresh. Activation power is roughly proportional to the length of the wordline and the amount of capacitive loading on the wordline, both of which are approximately cut in half for half-page activation.

Figure 1C:
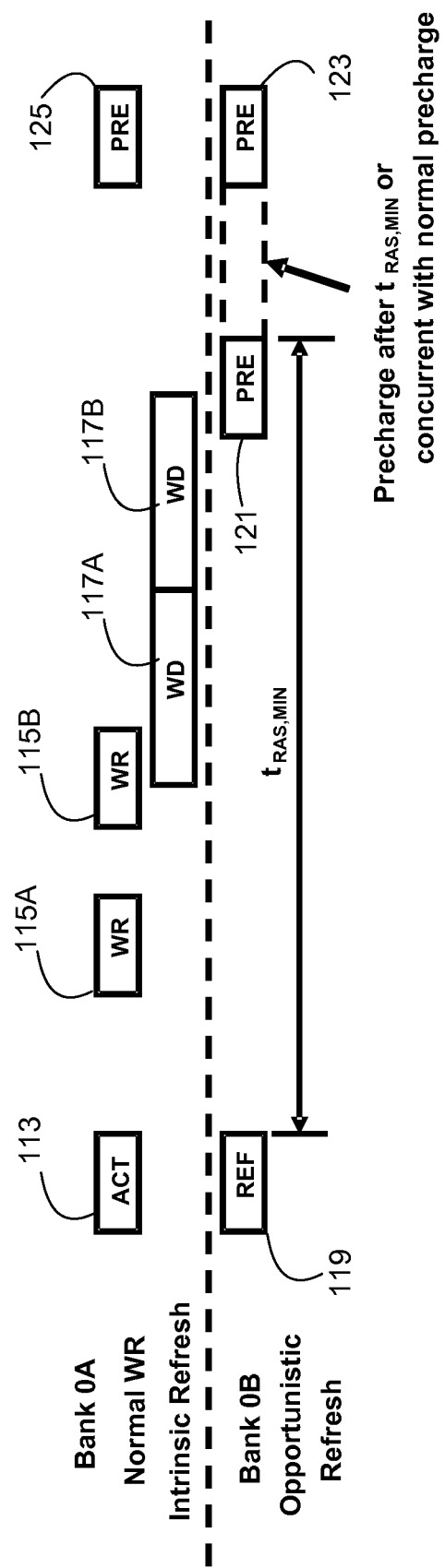
FIG. 1C illustrates a refresh transaction according to one embodiment.

Referring now to FIG. 1C, a timing diagram illustrates an example refresh transaction to Bank 0B that occurs while a data access transaction (in this example a write operation) is performed on Bank 0A according to an embodiment. Bank 0A and Bank 0B are included in logical Bank 0. Although FIG. 1C illustrates a refresh transaction performed on Bank 0B concurrent with a write transaction to Bank 0A, note that similar operations may be performed during a read transaction to Bank 0A. The scheduling of the refresh transaction in this example may be considered conflict-free because the memory controller supports only one open row per bank in the embodiment of FIG. 1B. As will be described in further detail below, a row address bit is used to select between transactions performed on Bank 0A or Bank 0B thus eliminating any conflicts.

Note that in the following description of FIG. 1C, the write transaction and the refresh transaction are described with respect to the rows discussed above from FIG. 1B. However, the write and refresh transactions illustrated in FIG. 1C are applicable to various embodiments discussed herein.

Continuing with reference to FIG. 1C, a memory controller issues an activate (ACT) command 113 to a memory device. A command interface of the memory device receives the ACT command 113 directed to row 105 of Bank 0A. As described previously, the memory device issues an internal activate control signal to activate row 105 as specified by a row address and a bank address corresponding to the ACT command 113. After some time, the memory controller issues a first write command (WR) 115A and a second write command (WR) 115B. The WR commands 115 are directed to row 105 of Bank 0A. The WR commands 115 are received by the memory device which in turn issues an internal control signal corresponding to the WR commands 115. The first write data phase (WD) 117A and second write data phase (WD) 117B are performed on the memory device that respectively correspond to the first write command 115A and second write command 115B. Thus, responsive to receiving the WR commands 115, the memory device performs the write operations on cells in the activated row 105.

Concurrent (i.e., substantially simultaneous) with the ACT command 113 directed to row 105 in Bank 0A, C/A block 109 in memory bank 111 issues an internal activate command (REF) 119 to activate row 107 of Bank 0B. In one embodiment, after $t_{RAS,MIN}$ has transpired, the C/A block 109 then issues a precharge command (PRE) 121 to Bank 0B to complete the opportunistic refresh of the cells of row 107. The memory device executes the PRE command 121 and issues an internal precharge control signal to precharge the cells of row 107. In an alternative embodiment, rather than issuing the precharge command after $t_{RAS,MIN}$, C/A block 109 concurrently issues a refresh precharge command 123 to Bank 0B with the precharge command 125 issued by the memory controller.

Figure 2:
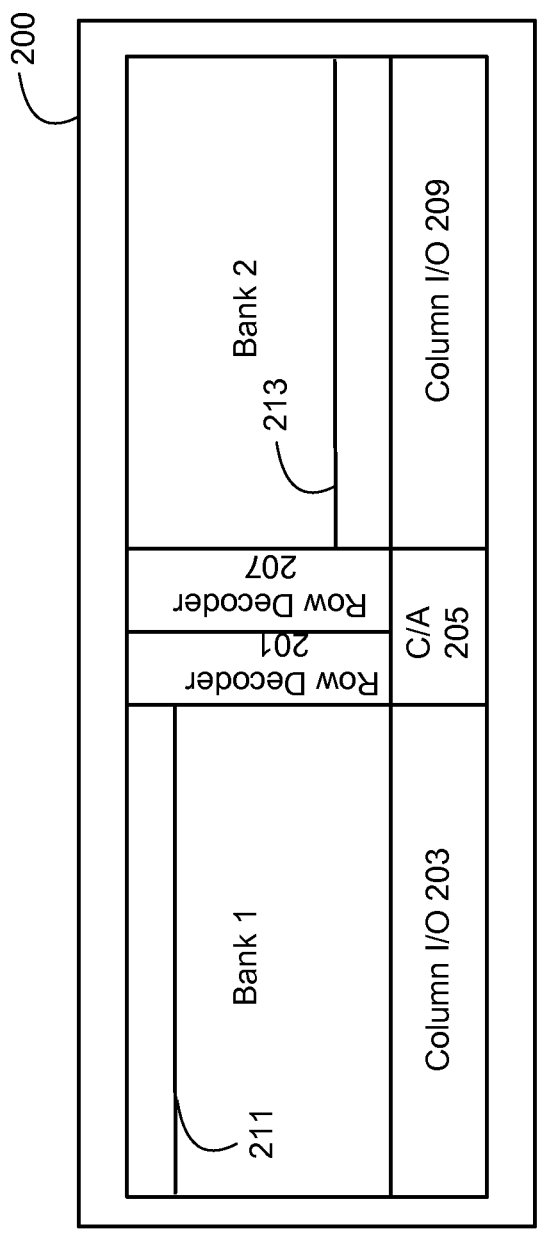
FIG. 2 illustrates two physical memory banks grouped as a single logical memory bank, according to one embodiment.

Referring now to FIG. 2, an embodiment is shown of a memory bank 200. Memory bank 200 comprises two physical memory banks from memory device 100 that are grouped together to form a single logical memory bank. A logical memory bank is considered an addressable array resource that is independently accessible on the basis of a unique bank address and may be simply considered as a "bank." With respect to memory device 100 (FIG. 1A), the pairing of physical memory banks results in memory device 100 comprising four logical memory banks rather than eight. The physical memory banks from memory device 100 may be paired with one another in any grouping. For example, adjacent memory banks (e.g., Bank 1 and Bank 2 of memory device 100 in FIG. 1A) may be paired to form a single logical memory bank. Non-adjacent memory banks (e.g., Bank 5 and Bank 7 of memory device 100 in FIG. 1A) may also be paired to form a single logical memory bank of memory device 100.

In FIG. 2, memory bank 200 comprises two memory regions: Bank 1 and Bank 2. In one embodiment, each memory region (Bank 1 and Bank 2) is a physical bank of memory device 100 that comprises its own row decoder and column I/O. Decoding and selecting a wordline in Bank 1 is performed by row decoder 201. Decoding and selecting a wordline in Bank 2 is performed by row decoder 207. C/A block 205 is coupled to both the first and second memory regions (Bank 1 and Bank 2). The functionality of the row decoders 201 and 207, column I/Os 203 and 209, and C/A block 205 are similar to the functionality of the row decoders, column I/Os, and C/A described with reference to FIG. 1. Thus, the functional description for row decoders 201 and 207, column I/Os 203 and 209, and C/A 205 is omitted for brevity.

To illustrate an opportunistic refresh in the embodiment shown in FIG. 2, consider an activate command issued by a memory controller to row 211 in the first memory region (Bank 1). A command interface of the memory device receives the activate command and in response, row 211 is activated in Bank 1. Specifically, in response to the activate command, C/A block 205 provides an internal activate control signal and a row address based on the activate command to row decoder 201. Row decoder 201 decodes the row address provided by C/A block 205 to determine which wordline to activate in Bank 1. In this example, row decoder 201 activates row 211 in Bank 1. After the internal activate control signal has been issued and the appropriate timing constraints have been met, C/A block 205 issues an internal data access control signal (read or write) to column I/O 203 that is directed to the addressed subset (i.e., column) of row 211. The internal data access control signal is provided by C/A block 205 responsive to the command interface receiving a data access command from the memory controller. Column I/O 203 determines which column(s) in Bank 1 need to be accessed based on the column address. Once all data access signals associated with row 211 have been issued and the appropriate timing constraints have been satisfied, C/A block 205 will issue a precharge control signal to precharge row 211. The precharge control signal is issued responsive to a precharge command being received by the command interface of the memory device. It should be noted that C/A block 205 may derive these internal activate, data access (e.g., read or write), and precharge control signals based on decoded commands from a memory controller. The commands issued by the memory controller are received by the memory device via an external bus connecting the memory controller and the memory device.

With further reference to FIG. 2, in an embodiment, the activate command directed to Bank 1 also causes an opportunistic refresh to substantially simultaneously occur in the second memory region (Bank 2). In this example, substantially concurrent with the activate command directed to Bank 1, C/A block 205 issues a refresh activate control signal to row decoder 207. Row decoder 207 decodes the row address in Bank 2 that is associated with the refresh activate control signal and opens the addressed wordline accordingly. In this example, row 213 of Bank 2 is opened. C/A block 205 issues a precharge control signal to row 213, completing the opportunistic refresh operation. Thus, row 213 in Bank 2 is refreshed in response to an activate command being directed to row 211 of Bank 1. In one embodiment, row 213 may correspond to the same row addressed by the activate command that is directed to Bank 1. In other embodiments, row 213 may be a distinct row different from the row 211 accessed in Bank 1.

Figure 3:
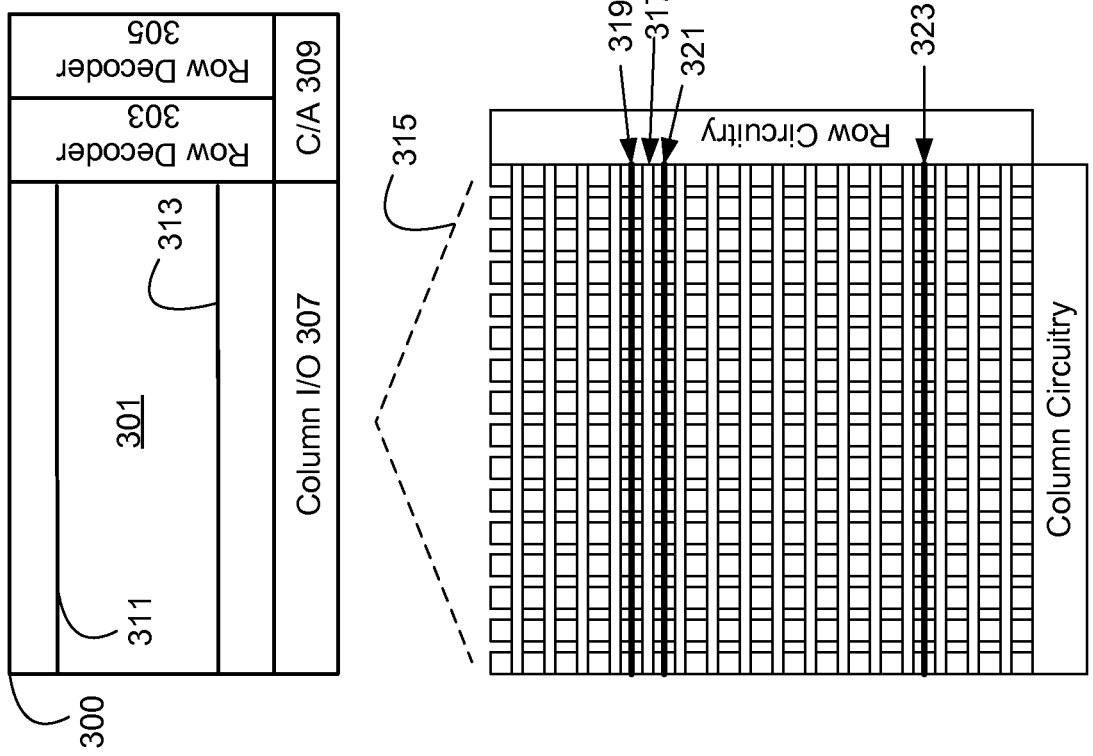
FIG. 3 illustrates a single memory bank and a detailed view of an array block of the memory device, according to one embodiment.

Referring now to FIG. 3, an embodiment is shown of a memory bank 300 comprising a single memory region 301. Memory bank 300 may be representative of one of the memory banks in memory device 100 of FIG. 1A. Memory bank 300 comprises a single memory region 301. In the embodiment of FIG. 3, an activate command is directed to a first wordline in memory region 301 simultaneous with an opportunistic refresh activate command directed to a second wordline in the same memory region 301.

In one embodiment, because two wordlines are activated in a single memory region responsive to an activate command directed to a first wordline, an additional row decoder is needed to activate the second wordline for opportunistic refresh. Thus, memory bank 300 comprises two full row decoders, row decoder 303 and row decoder 305, to support the full row address space. Row decoders 303 and 305 may have common circuitry as long as this does not interfere with simultaneous activation of two wordlines in memory bank 300. Memory bank 300 also comprises a column I/O 307 and C/A block 309. The functionality of the row decoders, column I/O, and C/A block illustrated in FIG. 3 is similar to the function of the corresponding components in FIG. 1B and a detailed explanation of those components are omitted for brevity.

To illustrate an opportunistic refresh in the embodiment shown in FIG. 3, consider an activate command issued by a memory controller to row 311 in the memory bank 300. A command interface of the memory device receives the activate command and in response, row 311 is activated in memory region 301. Specifically, in response to the activate command, C/A 309 provides an internal activate control signal and a row address based on the activate command to row decoder 303. Row decoder 303 decodes the row address provided by C/A block 309 to determine which wordline to activate in memory bank 300. In this example, row decoder 303 activates row 311 in the memory bank 300. After the internal activate control signal has been issued and the appropriate timing constraints have been met, C/A block 309 issues an internal data access control signal to column I/O 307 that is directed to the addressed subset of row 311. The internal data access control signal is provided by C/A block 309 in response to the command interface receiving a data access command from the memory controller. Column I/O 307 determines which column(s) in the memory bank 300 need to be accessed based on the column address control signal provided by C/A block 309. Once all data access signals associated with row 311 have been issued and the appropriate timing constraints have been satisfied, C/A block 309 will issue a precharge control signal to precharge row 311. The precharge control signal is issued in response to a precharge command being received by the command interface of the memory device.

In one embodiment, the activate command directed to memory bank 300 also causes an opportunistic refresh activate to occur simultaneously in memory bank 300 albeit to a different wordline. In this example, substantially simultaneous with the activate command directed to row 311, C/A block 309 issues a refresh activate control signal to row decoder 305. Row decoder 305 decodes the row address associated with the refresh activate control signal and opens the addressed wordline accordingly. In this example, row 313 is opened. As described previously, the process of activating a row involves sensing data from the storage cells associated with the activated wordline using local sense amplifiers thereby refreshing the storage cells associated with the activated wordline. C/A block 309 then issues a precharge control signal to row 313, completing the opportunistic refresh operation. Thus, after being activated, row 313 in memory region 301 is opportunistically refreshed in response to an activate command being directed to row 311. The local sense amplifiers associated with row 313 will not be connected to the array data lines, therefore performing only the refreshing the storage cells in row 313 while the local sense-amplifiers of row 311 will be connected to the array data lines as required for a read or write operation.

Because two rows are activated within a single memory bank 300, conflicts may occur when an activate command is issued to a first row and an opportunistic refresh activate command is issued to a second row, where both the first and second rows share the same sense amplifier. In one embodiment, to avoid conflicts, an activate command and a simultaneous refresh activate command are only directed to rows that have separate local sense amplifiers.

An enlarged view 315 of an array block from the memory bank 300 is shown in FIG. 3 to illustrate how to determine which rows to concurrently activate and refresh within the same memory region 301. The enlarged view 315 illustrates that storage rows corresponding to wordlines 319 and 321 are accessed by (or "share") sense amplifier 317. Because wordline 319 and wordline 321 share a common sense amplifier 317, these wordlines cannot be simultaneously activated for normal activation and refresh. However, wordline 323 does not share a sense amplifier with either wordline 319 or wordline 321. Thus, wordline 323 may be activated for refresh simultaneously and normal activation of either wordline 319 or wordline 321. Therefore, in response to receiving an activate command directed to a first row, a refresh operation issued by C/A 309 (i.e., a refresh activate control signal and precharge control signal) is transmitted to a second row that does not share a sense amplifier with the first row in the same memory bank 300.

Figure 4B:
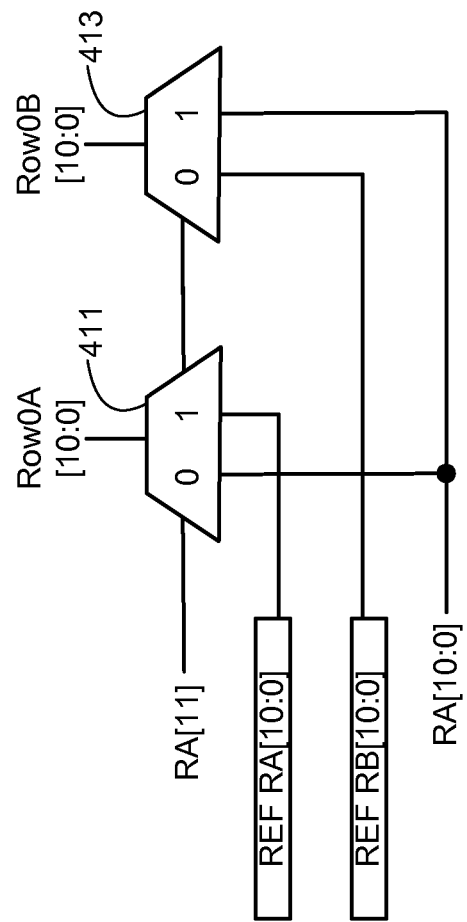
FIG. 4B illustrates logic used to select and drive two separate row addresses in a memory device, according to one embodiment.
Figure 4A:
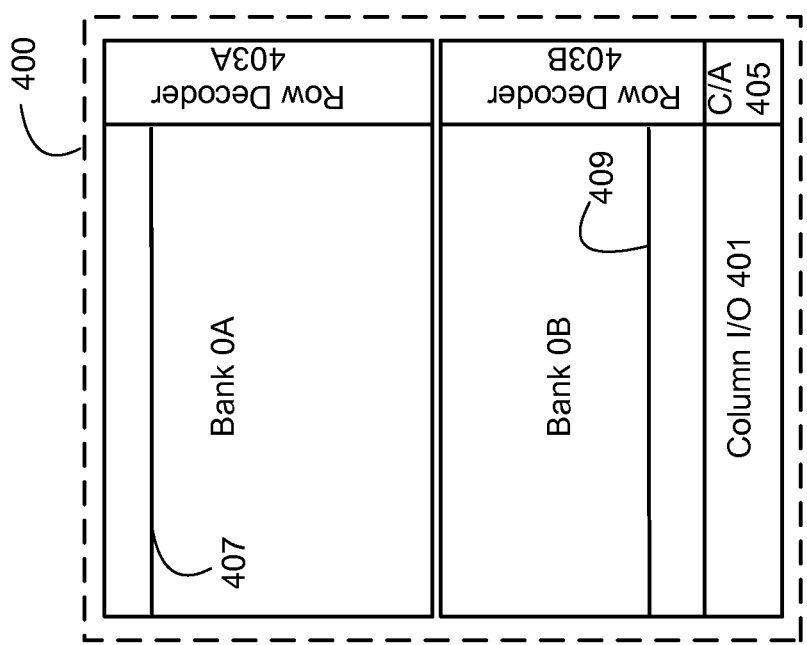
FIG. 4A illustrates a memory device bank comprising two memory regions that use partial row decoders, according to one embodiment.

Referring now to FIG. 4A, one embodiment is shown of a memory bank 400 of memory device 100 of FIG. 1A. Specifically, FIG. 4A illustrates Memory Bank 0 of memory device 100 of FIG. 1A. However, note that the other memory banks of memory device 100 of FIG. 1A may include a similar memory structure as memory bank 400.

In an embodiment Memory Bank 0 is a single physical bank that is addressed by a memory controller as a single logical bank. Memory bank 400 is horizontally subdivided to create two sub-banks (i.e., sub-memory regions) of Memory Bank 0: Bank 0A and Bank 0B. Thus, if memory bank 400 comprises 4K rows, for example, the first 2K rows are included in Bank 0A and the last 2K rows are included in Bank 0B.

In one embodiment, instead of using dual full row decoders that each support the full row address space as illustrated in FIG. 3, the embodiment shown in FIG. 4A uses dual partial row decoders. In one embodiment, each partial row decoder supports half the row address space of memory device 400 compared to the full row decoder in FIG. 3. By using dual partial row decoders, die area overhead may be reduced relative to the embodiment of FIG. 3. Row decoder 403A is used to decode the row addresses of commands issued to the rows included in the first memory region (Bank 0A) whereas row decoder 403B is used to decode the row addresses of commands issued to the rows included in the second memory region (Bank 0B).

In one embodiment, the first memory region and the second memory region share a column I/O 401 and C/A block 405. The functionality of column I/O 401 is similar to the column I/Os previously discussed above. Thus, the functional description for column I/O 401 is omitted for brevity.

C/A block 405 selects which memory region receives activate commands or refresh commands. FIG. 4B is illustrative of a detailed view of the C/A block 405 in accordance with one embodiment. In one embodiment, C/A block 405 includes multiplexer (MUX) 411 and MUX 413. MUX 411 is configured to transmit row address information directed to Bank 0A. MUX 413 is similarly configured to transmit row address information directed to Bank 0B. In one embodiment, each row address comprises 12 bits (e.g., RA[11:0]) where the most significant bit (i.e., RA[11]) specifies which memory region is activated in memory bank 400 for a normal access and RA[10:0] is used to select a row in the region. Below is one example of a table describing which memory region receives an opportunistic refresh command based on the value of RA[11].

| RA[11] | Bank 0A | Bank 0B |
|---|---|---|
| 0 | Activate to RA[10:0] | Refresh Activate to REF RB[10:0] |
| 1 | Refresh Activate to REF RA[10:0] | Activate to RA[10:0] |

Responsive to RA[11] being at logic level low (e.g., "0"), MUX 411 provides a row address (Row0A[10:0]) to Bank 0A and MUX 413 provides a refresh row address B (REF RB[10:0]) to Bank 0B. For example, RA[11] at logic level low causes MUX 411 to provides the row address corresponding to row 407 to Bank 0A and causes MUX 413 to substantially simultaneously provide a refresh row address B corresponding to row 409 to Bank 0B. Responsive to RA[11] being at logic level high (e.g., "1"), MUX 413 provides a row address (Row0B[10:0]) to Bank 0B. MUX 411 issues a refresh row address A (REF RA[10:0]) to Bank 0A. For example, RA[11] logic level high causes a row address corresponding to row 409 to be provided to Bank 0B and substantially simultaneously causes a refresh row address A corresponding to row 407 to be provided to Bank 0A.

Figures 5A, 5B:
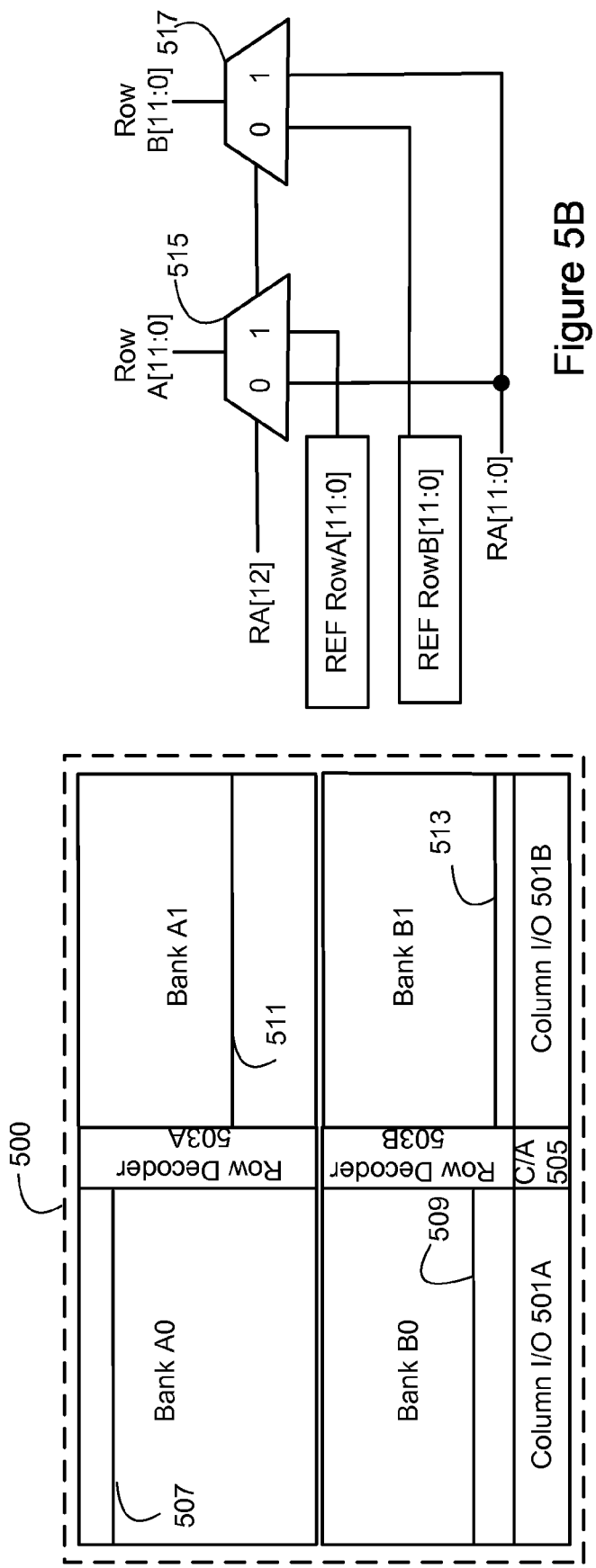
FIG. 5A illustrates a memory device bank comprising four memory regions that use partial row decoders.
FIG. 5B illustrates logic used to select and drive two separate row addresses: one for a read or write access to one memory region and the other for a refresh to a different memory region, according to one embodiment.

Referring now to FIG. 5A, there is shown another embodiment of performing opportunistic refreshes within memory device 100 of FIG. 1A. In the embodiment of FIG. 5A, memory bank 500 represents a memory bank of memory device 100 of FIG. 1A. Note that each of the other memory banks of memory device 100 of FIG. 1A may comprise a similar structure to memory bank 500.

Memory bank 500 is representative of a single memory bank from memory device 100 of FIG. 1A. Memory bank 500 is a single physical region that has been sub-divided to create four memory regions or sub-banks Bank A0 is located at the top left quadrant of memory bank 500, Bank A1 is located at the top right quadrant of memory bank 500, Bank B0 is located at the lower left quadrant of memory bank 500, and Bank B1 is located at the lower right quadrant of memory bank 500.

In one embodiment, memory bank 500 comprises partial row decoders that use half page activation. To reduce power consumption, the row decoders are centrally located between memory regions. Thus, a pair of horizontally opposing memory regions shares a common row decoder. In the embodiment illustrated in FIG. 5A, row decoder 503A is coupled to Bank A0 and Bank A1 which may be considered the first logical memory sub-bank in memory bank 500 according to one embodiment. Row decoder 503A selects wordlines for activate commands and refresh activate commands for both Bank A0 and Bank A1. Similarly, row decoder 503B is coupled to Bank B0 and Bank B1 which may be considered the second logical memory sub-bank of memory bank 500 according to one embodiment. Row decoder 503B also selects wordlines for activate commands and opportunistic refreshes for Bank B0 and Bank B1 according to one embodiment.

In one embodiment, each half page (e.g., Bank A0 and Bank B0, or Bank A1 and Bank B1) of the memory device 500 has its associated column I/O used to select column(s) in an activated row for data access. Column I/O 501A directs data-access commands to columns in the memory regions located in the left half of memory bank 500. Thus, in the embodiment shown in FIG. 5A, column I/O 501A is used to direct data-access commands to Bank A0 and Bank B0. Similarly, column I/O 501B directs data-access commands to the memory regions located in the right half of memory bank 500 (i.e., Bank A1 and Bank B1).

In one embodiment, C/A block 505 selects which specific memory region receives activate control signals or refresh control signals respectively derived from activate or refresh commands issued by a memory controller. C/A block 505 is configured to use a row address bit to select a wordline from a memory region located to the left or right of the partial row decoders. In one embodiment, thirteen row address bits (RA[12:0]) are used to address 8K sub-rows. For example, a single memory bank generally comprises 4K rows. Because the memory bank 500 has been sub-divided into four equal memory regions and half page activation is used, a total of 8K sub-rows are addressed by RA[12:0] where each memory region comprises 2K sub-rows.

In one embodiment, the most significant bit (e.g., RA[12]) of a row address is used to select whether the first logical memory sub-bank (i.e., the top half of memory bank 500) comprising Bank A0 and Bank A1 or the second logical memory sub-bank (i.e., the bottom half of memory device 500) comprising Bank B0 and Bank B1 is activated in response to an activate command associated with that row address. The next most significant bit (e.g., RA[11]) is used to select the specific memory region from the first logical memory sub-bank or the second logical memory sub-bank that receives the activate command. Thus, RA[11] selects whether the left or right memory region from the first logical memory sub-bank or the second logical memory sub-bank receives the activate command. RA[11:0] is decoded by row decoders 503A and 503B to determine which row in the selected memory region should be activated.

FIG. 5B is illustrative of a detailed view of the row address logic portion of C/A block 505 in accordance with one embodiment. In one embodiment, C/A block 505 comprises MUX 515 and MUX 517. MUX 515 is configured to transmit row address information directed to the memory regions located in the first logical memory sub-bank of memory bank 500 (e.g., Bank A0 and Bank A1). MUX 517 is similarly configured to transmit row address information directed to the memory regions located in the second logical memory sub-bank of memory bank 500 (e.g., Bank B0 and Bank B1).

As mentioned previously, in one embodiment RA[12] specifies whether the first logical memory sub-bank or the second logical memory sub-bank are selected for activation in response to an activate command. In addition, RA[11] specifies which specific memory region in the selected logical memory sub-bank is activated in response to the activate command. In one embodiment, a first refresh controller is associated with the first logical memory sub-bank of memory bank 500 and a second refresh controller is associated with the second logical memory sub-bank. Each refresh controller transmits a refresh address (e.g., REF RowA[11:0] or REF RowB[11:0]) to its associated logical memory sub-bank in response to the opposing bank being directed an activate command.

According to one embodiment, the most significant bit of the refresh address (REF Rown[11], n=A or B) controls whether the left or right region in the opposing logical memory sub-bank is refreshed. REF Rown[10:0] determine which specific row in the selected memory region is refreshed. Below is one example of a table describing which memory region is refreshed based on the value of RA[12:11] and REF Rown[11] associated with the activate command.

| RA[12:11] | REF Rn[11] | Bank A0 | Bank A1 | Bank B0 | Bank B1 |
|---|---|---|---|---|---|
| 00 | 0 | Activate to RowA[10:0] | | Refresh Activate RowB[10:0] | |
| | 1 | Activate to RowA[10:0] | | | Refresh Activate RowB[10:0] |
| 01 | 0 | | Activate to RowA[10:0] | Refresh Activate REF RowB[10:0] | |
| | 1 | | Activate to RowA[10:0] | | Refresh Activate REF RowB[10:0] |
| 10 | 0 | Refresh Activate REF RowA[10:0] | | Activate to RowB[10:0] | |
| | 1 | | Refresh Activate REF RowA[10:0] | Activate to RowB[10:0] | |
| 11 | 0 | Refresh Activate REF RowA[10:0] | | | Activate to RowB[10:0] |
| | 1 | | Refresh Activate REF RowA[10:0] | | Activate RowB[10:0] |

In one embodiment, a value of "00" for RA[12:11] indicates that the top left memory region, Bank A0, is selected for data access. Specifically, the first low bit value corresponding to RA[12] selects the first logical memory sub-bank and the second low bit value corresponding to RA[11] selects the left memory region of the first logical memory sub-bank (e.g., Bank A0). The low RA[12] value causes MUX 515 to provide a row address (RowA[11:0]) of a row in the memory region specified by RA[11] to Bank A0. For example, MUX 515 provides the row address corresponding to row 507 in Bank A0.

The low RA[12] value also causes MUX 517 to propagate, for purposes of refresh, a refresh row address B (REF RowB [11:0]) to row decoder 503B to decode a row address, the row residing in the opposing logical memory sub-bank (e.g., the second logical memory sub-bank). Row decoder 503B decodes REF RowB[11] to determine whether a row in the left or right memory region is activated. A low REF RowB [11] value indicates that the left memory region that opposes the logical memory sub-bank selected for data access receives the row address. In this example, the activation of row 507 in Bank A0 causes row 509 in Bank B0 to be opportunistically refreshed. In contrast, a high REF RowB[11] value indicates that a row in the right memory region of the second logical memory sub-bank receives the row address. In this example, the activation of row 507 in Bank A0 causes row 513 in Bank B1 to be opportunistically refreshed.

In one embodiment, a value of "01" for RA[12:11] indicates that the top right memory region, Bank A1, is selected for data access. Specifically, the first low bit value corresponding to RA[12] selects the first logical memory sub-bank of memory bank 500 and the second high bit value corresponding to RA[11] selects the right memory region of the first logical memory sub-bank. The low RA[12] value causes MUX 515 to provide a row address (RowA[11:0]) to row decoder 503A to decode the row address. A high RowA[11] value causes row decoder 503A to activate a wordline in Bank A1 corresponding to a decode of RowA[10:0]. For example, row 511 in Bank A1 is activated.

The low RA[12] value also causes MUX 517 to propagate, for purposes of refresh, a refresh row address B (REF RowB [11:0]) to row decoder 503B, which resides in the opposing logical memory sub-bank (e.g., the second logical memory bank). Row decoder 503B decodes REF RowB[11:0] to decode the row address. A low REF RowB[11] value indicates that a row in the left memory region (e.g., Bank B0) is selected for refresh. For example, REF RowB[11:0] may correspond to row 509 in the second logical memory sub-bank. Thus, the activation of row 511 in Bank A1 causes row 509 in Bank B0 to be opportunistically refreshed. In contrast, a high REF RowB[11] value indicates that a row in the right memory region (e.g., Bank B1) is selected for refresh. For example, REF RowB[11:0] may correspond to row 513 in Bank B1. Thus, the activation of row 511 in Bank A1 causes row 513 in Bank B1 to be opportunistically refreshed.

In one embodiment, a value of "10" for RA[12:11] indicates that the bottom left memory region, Bank B0, is selected for data access. Specifically, the high bit value corresponding to RA[12] selects the second logical memory sub-bank of memory bank 500 and the low bit value corresponding to RA[11] selects the left memory region of the second logical memory sub-bank of memory bank 500. The high RA[12] value causes MUX 517 to provide, for purposes of row activation, a row address (RowB[11:0]) to row decoder 503B to decode the row address. A low RowB[11] value causes row decoder 503B to activate a wordline in Bank B0 corresponding to a decode of RowB[10:0]. For example, row 509 in Bank B0 is activated.

The high RA[12] value also causes MUX 515 to propagate, for purposes of refresh, a refresh row address A (REF RowA[11:0]) to row decoder 503A, which resides in the opposing logical memory bank. Row decoder 503A decodes REF RowA[11] to determine whether a row in the left or right memory region is activated. A low REF RowA[11] value indicates that a row in the left memory region (e.g., Bank A0) is selected for refresh. For example, REF RowA[11:0] may correspond to row 507 in the first logical memory sub-bank. Thus, the activation of row 509 in Bank B0 causes row 507 in Bank A0 to be opportunistically refreshed. In contrast, a high REF RowA[11] value indicates that a row in the right memory region (e.g., Bank A1) is selected for refresh. For example, REF RowA[11:0] may correspond to row 511 in Bank A1. Thus, the activation of row 509 in Bank B0 causes row 511 in Bank A1 to be opportunistically refreshed.

In one embodiment, a value of "11" for RA[12:11] indicates that the bottom right memory region, Bank B1, is selected for data access. Specifically, the high bit value corresponding to RA[12] selects the second logical memory sub-bank of memory bank 500 and the high bit value corresponding to RA[11] selects the right memory region of the second logical memory sub-bank. The high RA[12] value causes MUX 517 to provide a row address (RowB[11:0]) to row decoder 503B to decode the row address. A high RowB[11] value causes a wordline in the right memory region (Bank B1) to be activated. For example, row 513 in Bank B1 is activated.

The high RA[12] value also causes MUX 515 to propagate, for purposes of refresh, a refresh row address (REF RowA[11:0]) to row decoder 503A to decode a row address. Row decoder 503A decodes REF RowA[11] to determine whether a row in the left or right memory sub-bank region is activated for opportunistic refresh. A low REF RowA[11] value indicates that the left memory region (e.g., Bank A0) is selected for refresh. For example, REF RowA[11:0] may correspond to row 507 in Bank A0 located in the first logical memory sub-bank. Thus, the activation of row 513 in Bank B1 causes row 507 in Bank A0 to be opportunistically refreshed. In contrast, a high REF RowA[11] value indicates that a row in the right memory region (e.g., Bank A1) is selected for refresh. For example, REF RowA[11:0] may correspond to row 511 in Bank A1. Thus, the activation of row 513 in Bank B1 causes row 511 in Bank A1 to be opportunistically refreshed.

Memory System Architecture

Figure 6:
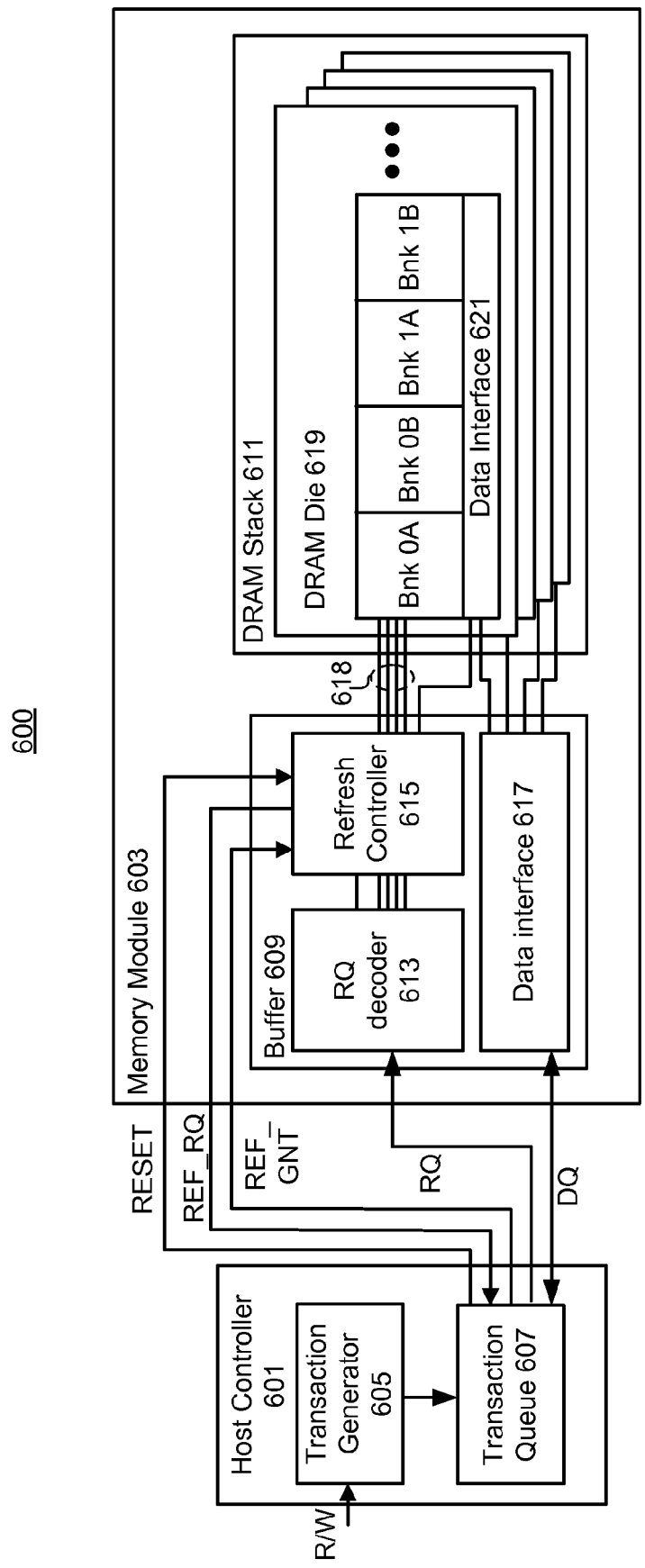
FIG. 6 illustrates a memory system in which refreshes are performed in one or more DRAM die of a memory module, according to one embodiment.

Referring now to FIG. 6, there is shown one embodiment of a memory system 600 for performing opportunistic refreshes (e.g., opportunistic refresh activate and opportunistic refresh precharge) responsive to normal activation of rows in memory regions of a memory module of a memory device. System 600 supports opportunistic refreshing of memory regions described in the memory devices previously described in FIGS. 1 through 5. Note that memory devices other than those described herein may be used for implementation of the functionality described herein.

In one embodiment, system 600 includes a host controller 601 and memory module 603. A request interconnect (RQ) carries memory requests including command and address information from host controller 601 to memory module 603. In one embodiment, a data interconnect (DQ) carries data information between host controller 601 and a memory module 603.

In one embodiment, host controller 601 accesses banks of storage cells in memory regions (e.g., Bank 0A, Bank 0B, etc.) included in memory module 603 by issuing an activate command followed by a corresponding data access request (e.g., a read or write command). Host controller 601 comprises a transaction generator 605 that receives read/write (R/W) instructions from a compute resource (such as a microprocessor of a computer, not shown herein). In one embodiment, R/W instructions are considered data access transactions. The host controller 601 may also be integrated with memory functionality on a system on chip (SoC).

In one embodiment, host controller 601 also schedules refresh requests. Scheduled refreshes differ from opportunistic refreshes in that opportunistic refreshes occur concurrently with normal activate commands associated with data access transactions. That is, an opportunistic refresh is a refresh to one portion of a memory bank that occurs concurrently with a row activation to another portion of the memory bank. In contrast, scheduled refreshes are performed in order to refresh wordlines that have not been refreshed as a result of an opportunistic refresh or through an intrinsic refresh.

In one embodiment, host controller 601 transmits normal activate commands (and their associated data access transactions) and scheduled refresh commands in the order that they are received in a transaction queue 607. In one embodiment, the transaction queue 607 is a first-in first-out (FIFO) register that stores sequences of normal activate commands and scheduled refresh commands. The normal activate commands and scheduled refresh commands are communicated as requests to memory devices on the memory module 603.

In one embodiment, memory module 603 comprises a DRAM stack 611 comprising a plurality of DRAM die 619. Each DRAM die 619 comprises a plurality of logical memory banks, and each logical memory bank comprises a plurality of regions. In the embodiment shown in FIG. 6, DRAM die 619 comprises Bank 0A, Bank 0B, Bank 1A, and Bank 1B, etc. Note that the memory regions illustrated in FIG. 6 are representative of the different memory device architectures previously described above.

In one embodiment, each memory region has a plurality of sense amplifiers (not shown). When data stored in a row of DRAM storage cells has been sensed by the sense amplifiers in response to an activate command, the data is available for access by subsequent read and write operations.

In one embodiment, the memory regions included in DRAM die 619 are coupled to data interface 621. In one embodiment, a buffer 609 transmits activate commands and opportunistic refresh requests to the DRAM stack 611. Each DRAM die 619 decodes these commands and directs them to the appropriate bank. In one embodiment, data interface 621 may be shared by each DRAM die 619. Data interface 621 communicates data from and to buffer 609 in response to normal write or read commands, respectively.

In an embodiment, the DRAM stack 611 is coupled to the buffer 609, which issues refresh commands (e.g., opportunistic and scheduled) to DRAM stack 611 via signal lines 618. In an embodiment, the buffer 609 includes a request decoder 613. The request decoder 613 receives activate commands and scheduled refresh instructions from the host controller 601. The request decoder 613 determines which logical memory bank is associated with the received commands and provides the commands to the appropriate request logic included in the refresh controller 615 as will be described in further detail below.

In one embodiment, the refresh controller 615 determines which rows in the memory regions included in DRAM die 619 to issue opportunistic refresh commands (e.g., refresh activate commands and refresh precharge commands) responsive to receiving activate commands from the request decoder 613. The refresh controller 615 issues a refresh activate command simultaneous with an activate command to the DRAM stack 611 via signal lines 618. The refresh activate command causes a wordline of one (or more) memory regions to be opportunistically refreshed responsive to another wordline in the same memory region or another memory region being issued an activate command.

As an example, R/W request may be received by the transaction generator 605. Accordingly, the transaction generator 605 generates an activate command (and corresponding data access command) for the request that is communicated to the transaction queue 607. The transaction queue 607 transmits the activate command and the associated data access command to the request decoder 613. The request decoder 613 determines the logical memory bank in the memory that is associated with the request and communicates the activate command to the refresh controller 615.

The refresh controller 615 issues the activate command to DRAM stack 611 via command interface 618 as well as a refresh activate command. The signal lines 618 interface to C/A block of each logical memory bank as shown in FIGS. 1B and 2-5. The C/A block communicates an activate control signal and refresh activate control signal respectively derived from the activate command and refresh activate command to the memory region addressed by the command. The activate control signal activates a wordline in the memory region. After a subsequent read or write command has been issued, data is either read from or written to the activated wordline, while another wordline may be opportunistically refreshed substantially simultaneously with the read or write to the activated wordline. The data read from the activated wordline may then be communicated from the memory region to buffer 609 back through the data interface 621. In case of a read, data interface 617 included in buffer 609 receives the data stored in the activated wordline and communicates the data to the host controller 601. In the scenario of a write, data interface 617 communicates the data from the host controller 601 to data interface 621.

In one embodiment, the refresh controller 615 also determines the next row in a memory region in which to perform an opportunistic refresh responsive to receiving a activate command from the RQ decoder 613. The determined row is then refreshed when the next activate command is received. With respect to the embodiment illustrated in FIG. 1, assuming that the activate command in this example is directed to Bank 0A, the refresh controller 615 may determine a wordline in Bank 0B to refresh responsive to the next activate command that is received.

In one embodiment, responsive to a predetermined time interval elapsing in which the refresh controller 615 performs opportunistic refreshes (i.e., an opportunistic refresh interval) on memory regions on DRAM die 619, the refresh controller 615 transmits a refresh request (REF_RQ) to the host controller 601. According to one embodiment, the refresh request is a request for the host controller 601 to issue a scheduled refresh transaction to refresh rows of memory regions that were not refreshed opportunistically or intrinsically. Responsive to receiving the refresh request, the host controller 601 completes data access transactions in transaction queue 607 in preparation for performing scheduled refresh transactions.

By performing the scheduled refreshes, the data in the wordlines that were not opportunistically or intrinsically refreshed are maintained. The host controller 601 grants the refresh request, which is received by the refresh controller 615 as an acknowledgement, such as a refresh grant (REF_GNT) signal, indicating approval of the refresh request. The host controller 601 subsequently issues a scheduled refresh transaction to the refresh controller 615 to refresh rows that were not refreshed during the opportunistic refresh interval. In one embodiment, the scheduled refresh transaction comprises a scheduled refresh of four groups of memory regions, where each group specifies four rows of four distinct memory regions. The scheduled refresh transaction will be described in further detail below.

Refresh Controller Architecture

Figure 7:
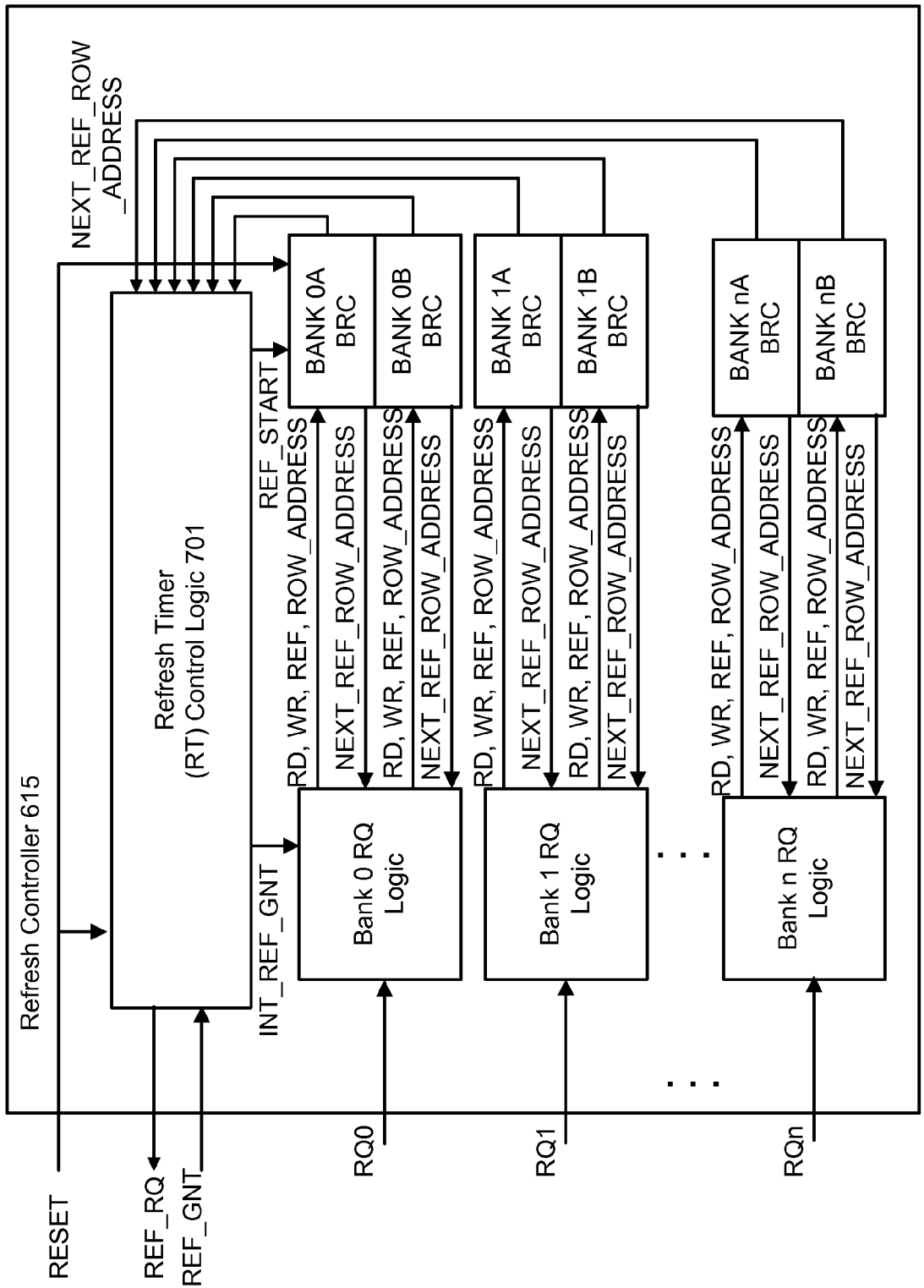
FIG. 7 illustrates a detailed view of a refresh controller, according to one embodiment.

Referring now to FIG. 7, there is shown one embodiment of the refresh controller 615. The refresh controller 615 comprises N bank request (RQ) logic blocks numbered 0 to n, where n=N−1 and where N is an integer not less than 1 and is equivalent to the number of logical memory banks included in the DRAM stack 611. That is, the refresh controller 615 includes one bank RQ logic block for each logical memory bank in the DRAM stack 611. For example, Banks 0A and 0B are considered together to be one logical memory bank and are therefore associated with bank 0 RQ logic block. Additionally, Bank 1A and Bank 1B are organized into a single logical bank and thus are associated with bank 1 RQ logic block.

In one embodiment, each bank RQ logic block n receives a request (RQn) from the RQ decoder 613 corresponding to an activate command issued by host controller 601. As previously mentioned, the RQ decoder 613 determines the logical memory bank associated with an activate command in order to transmit the command to the appropriate bank RQ logic block. For example, the RQ decoder 613 issues requests (RQ0) that are intended for a memory region included in logical memory bank 0 to bank 0 RQ logic block. Similarly, bank 1 RQ logic block receives from RQ decoder 613 requests (RQ1) that are directed to logical memory bank 1, and so on.

In one embodiment, although not shown in FIG. 7, each bank RQ logic block transmits an activate command received from the RQ decoder 613 to the logical memory bank associated with the command. Furthermore, each bank RQ logic block is designed to simultaneously issue with the activate command, a refresh activate command to a memory region of the logical memory bank distinct from the memory region in which the activate command is directed. In one embodiment, the row that is opportunistically refreshed is the row specified in the NEXT_REF_ROW_ADDRESS generated by a bank refresh controller, as will be described in further detail below.

In one embodiment, the refresh controller 615 further comprises a bank refresh controller (BRC) for each memory region in the DRAM stack 611. For the case in which there are two memory regions within each of N logical memory banks, the refresh controller 615 comprises 2N BRCs where N is at least one and is equivalent to the number of logical memory banks included in the DRAM stack 611. In one embodiment, each BRC determines which rows in the associated memory region will be opportunistically refreshed concurrently with the next activate command that is issued to the logical memory bank including the memory region. That is, the BRC schedules the opportunistic refreshes for its associated memory region. For example, in the embodiment illustrated in FIG. 7, bank 0A BRC schedules opportunistic refreshes for Bank 0A and bank 0B BRC schedules opportunistic refreshes for Bank 0B.

For clarity, the following description of the operation of a BRC will be described with respect to Bank 0A BRC. However, the functionality described herein with respect to Bank 0A BRC is shared by each Bank BRC. As shown in FIG. 7, Bank 0A BRC and Bank 0B BRC are coupled to Bank 0 RQ logic module. Bank 0A BRC receives data access requests (e.g., read (RD) or write (WR)) and opportunistic or scheduled refresh requests (REF) from bank 0 RQ logic. The RD, WR, and REF commands are received by each BRC responsive to normal read, write, or scheduled refresh commands received by the RQ decoder 613. Each RD, WR, or REF request also specifies the row address (ROW_ADDRESS) within the memory region to which the request is directed. Based on the received request, bank 0A BRC determines a row within memory region Bank 0A in which to issue the next opportunistic refresh and generates the signals NEXT_REF_ROW_ADDRESS indicating such row to which to issue the next opportunistic refresh.

In one embodiment, Bank 0A BRC communicates the NEXT_REF_ROW_ADRESS signal to both the Bank 0 RQ logic module as well as to the refresh timer control logic 701. Responsive to receiving an activate command, Bank 0 RQ logic issues the refresh activate command to a row address of a memory region (e.g., Bank 0A) specified in the NEXT_REF_ROW_ADDRESS signal. Bank 0 RQ logic issues the refresh activate command in response to the activate command.

The refresh controller 615 comprises refresh timer (RT) control logic 701. The RT control logic 701 controls when opportunistic and scheduled refreshes are performed on the different memory regions included in DRAM stack 611. In one embodiment, RT control logic 701 comprises a finite state machine used to control a plurality of timers included in the RT control logic 701 that issue signals causing opportunistic and scheduled refreshes to occur. The logic of the finite state machine will be described below in further detail.

As mentioned above, RT control logic 701 comprises a plurality of timers (not shown). In one embodiment, the RT control logic 701 comprises an opportunistic refresh timer (not shown) that is configured to issue a command (e.g., REF_START) at predetermined time intervals (e.g., every 16 ms) to the BRCs to begin performing opportunistic refreshes. In one embodiment, the REF_START signal is indicative of the beginning of a refresh interval that includes an opportunistic refresh interval and a scheduled refresh interval which will be described below in further detail.

Furthermore, the RT control logic 701 comprises a scheduled refresh timer (not shown) that is configured to create an internal signal (BEGIN_SCH_REF) that causes the RT control logic 701 to communicate with the host controller 601 to begin issuing scheduled refreshes. Thus, the generation of the BEGIN_SCH_REF signal is indicative of the end of the opportunistic refresh interval in which opportunistic refresh commands are issued and is indicative of the beginning of the scheduled refresh interval. In one embodiment, the scheduled refresh timer may be programmable in order to modify when scheduled refreshes are issued.

In one embodiment, RT control logic 701 also creates an internal signal that ends the scheduled refresh request period (SCH_REF_DONE) allocated to a scheduled refresh transaction. Each scheduled refresh transaction is given a time period (i.e., the scheduled refresh request period) in which to complete the transaction. The SCH_REF_DONE signal is indicative of the completion of the scheduled refresh transaction.

Responsive to the BEGIN_SCH_REF signal, the scheduled refresh timer included in RT control logic 701 issues a refresh request (REF_RQ) to the host controller 601 that causes the host controller 601 to complete all outstanding transactions (e.g., data access commands) and issue a scheduled refresh transaction to refresh rows that were not refreshed opportunistically or intrinsically. RT control logic 701 receives from the host controller 601 a refresh grant signal (REF_GNT) indicating that the scheduled refresh transaction should be issued. In one embodiment, the REF_GNT signal is transmitted after a delay period (e.g., 100 ns) to allow any outstanding opportunistic refreshes to complete before beginning the scheduled refresh transaction.

In one embodiment, the scheduled refresh timer may comprise logic to determine the necessary average period in which to issue scheduled refresh requests (REF_RQs) within the scheduled refresh interval. The scheduled refresh timer determines which BRC contains the lowest row address value, which indicates which of the memory regions has progressed the least with respect to being refreshed via opportunistic refreshes. The scheduled refresh timer subtracts the address value from the total number of rows per memory region and divides the difference by the scheduled refresh interval value (e.g., 4 ms). The resulting value is indicative of the average period in which the RT control logic 701 issues scheduled refresh requests (e.g., scheduled refresh request period) to the host controller 601 during the scheduled refresh interval.

In one embodiment, the RT control logic 701 receives a RESET signal from the host controller 601. The RESET signal causes the RT control logic 701 to restart the timers (not shown) that control the refresh interval.

Figure 8A:
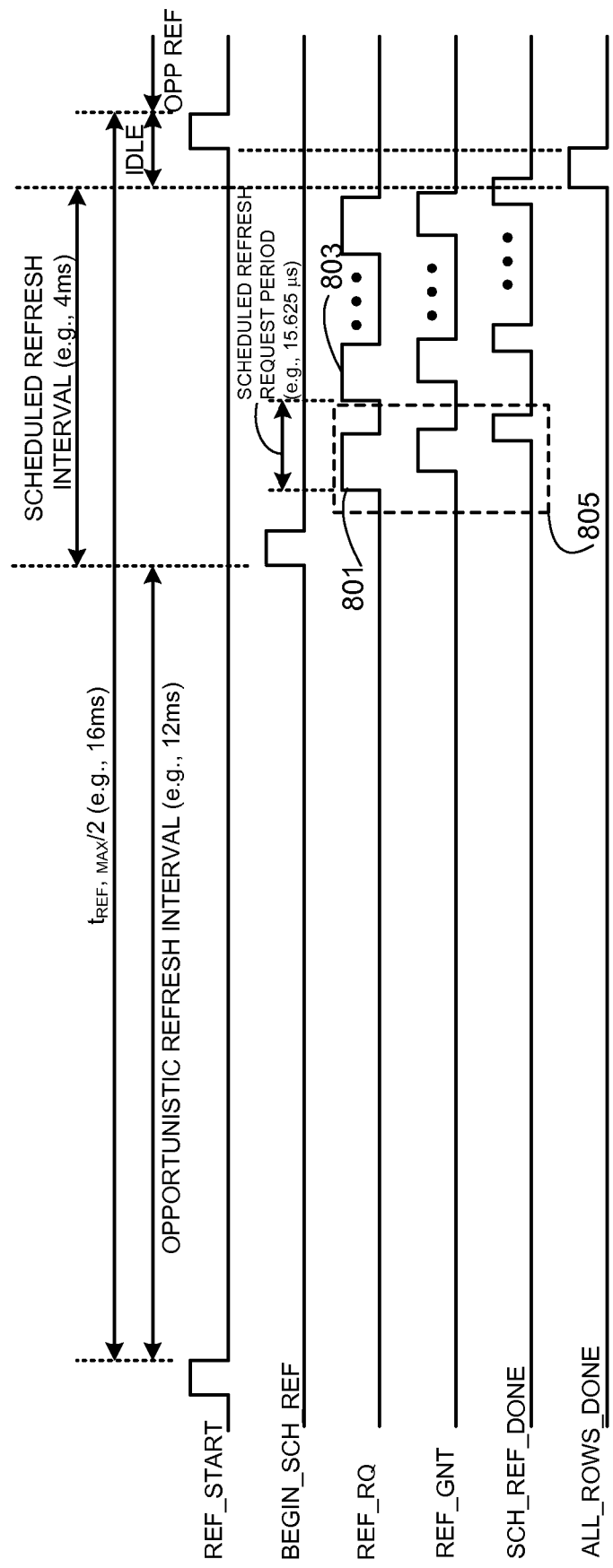
FIGS. 8A and 8B illustrate timing diagrams for performing refreshes, according to one embodiment.

Referring now to FIG. 8A there is shown one embodiment of a timing diagram that includes the various control signals used in the RT control logic 601 as discussed above. RT control logic 701 issues the REF_START signal to the BRCs indicating the start of the refresh period ($t_{REF}$) in which opportunistic and scheduled refreshes may be performed. In the example illustrated in FIG. 8A, the refresh period is 16 ms including 12 ms allocated to the opportunistic refresh interval and 4 ms allocated to the scheduled refresh interval. During the opportunistic refresh interval, the bank RQ logic issues opportunistic refreshes to their associated memory regions in response to activate commands received by the bank RQ logic, as described previously.

The RT control logic 701 creates an internal signal BEGIN_SCH_REF that indicates the end of the opportunistic refresh interval and the start of the scheduled refresh interval. The RT control logic 701 issues the first REF_RQ 801 to the host controller 601 if there remain any un-refreshed rows after the opportunistic refresh interval ends. Once the REF_RQ signal 801 is issued by the RT control logic 701 to the host controller 601, a scheduled refresh request period (e.g., 15.625 microseconds) is allocated to complete a scheduled refresh transaction issued by the host controller 601. During the scheduled refresh request period, the signals REF_RQ, REF_GNT, and SCH_REF_DONE are issued by a combination of the host controller 601 and the RT control logic 701. As mentioned previously, the REF_GNT signal indicates that the host controller 601 has granted the REF_RQ 801 and will issue the scheduled refresh transaction. The SCH_REF_DONE signal indicates that the scheduled refresh transaction is completed. Upon the next expiration of the scheduled refresh request timer, the RT control logic 701 issues another REF_RQ signal 803 to the host controller 601 to issue another scheduled refresh transaction. This cycle repeats until all rows have been refreshed, indicating the end of the scheduled refresh interval.

Figure 8B:
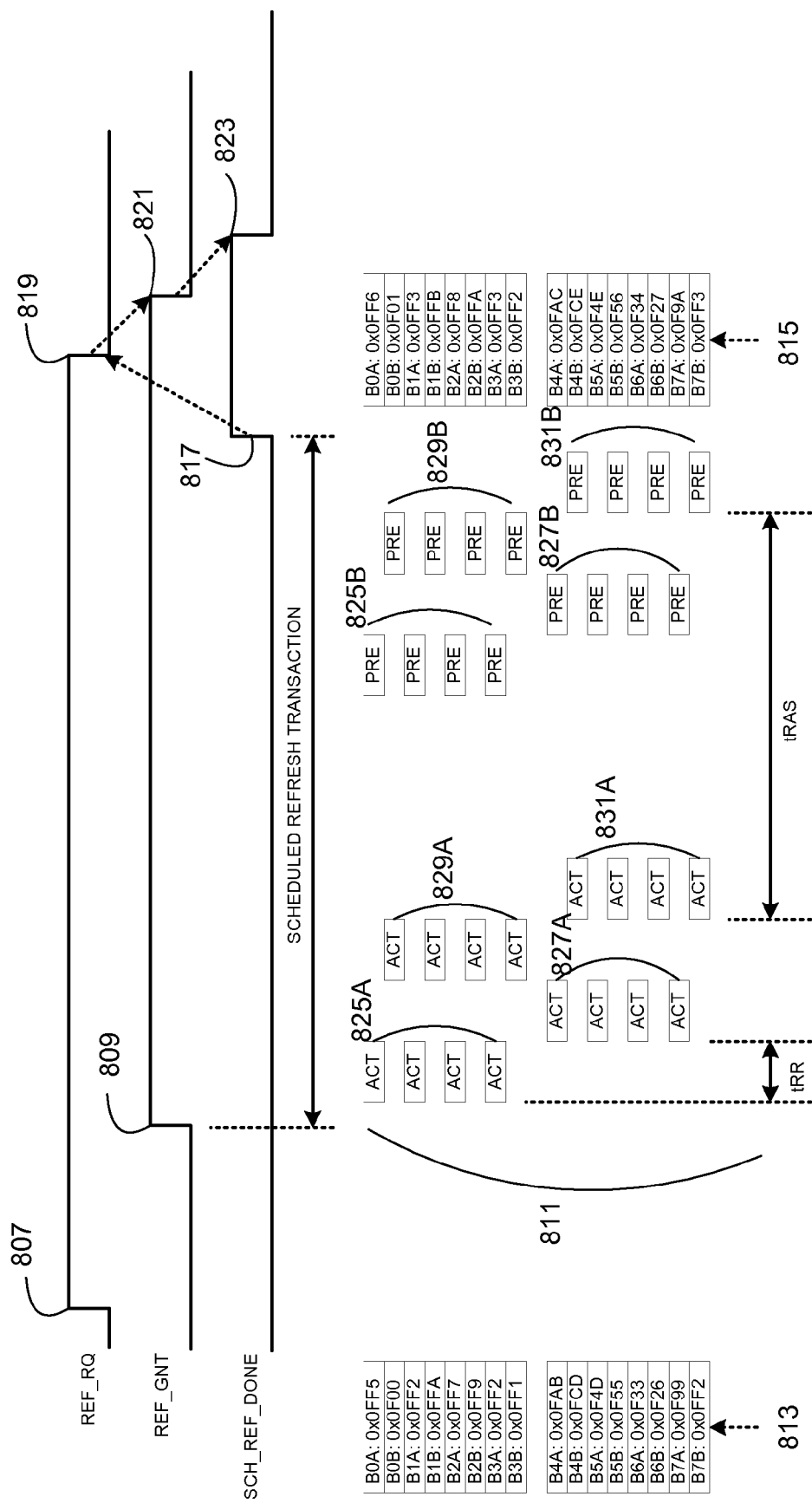

Referring now to FIG. 8B, a detailed view of the signals issued during a scheduled refresh request period 805 (see FIG. 8A) is shown. The rising edge 807 of REF_RQ indicates that the refresh controller 615 transmits a request to the host controller 601 to complete all outstanding data access transactions in order to perform a scheduled refresh transaction. The rising edge 809 of REF_GNT is transmitted by the host controller 401 to RT control logic 701 to indicate that the REF_RQ is granted and that a scheduled refresh transaction is to be issued by the refresh controller 615. As mentioned previously, in one embodiment, the scheduled refresh transaction comprises groups of memory regions in which to refresh. For example, the scheduled refresh transactions 811 illustrated in FIG. 8B are directed to four groups of memory regions. For example, the first group of memory regions receive activate commands 825A and precharge commands 825B issued to a row in each of bank 0A, bank 1A, bank 2A, and bank 3A. The second group of memory regions receives activate commands 827A and precharge commands 827B issued to a row in each of bank 4A, bank 5A, bank 6A, and bank 7A. The third group of memory regions receives activate commands 829A and precharge commands 829B issued to a row in each of bank 0B, bank 1B, bank 2B and bank 3B. The fourth group of memory regions receives activate commands 831A and precharge commands 831B issued a row in each of bank 4B, bank 5B, bank 6B, and bank 7B. One objective of staggering the refreshes by groups is to place a ceiling on the peak refresh current to relax power supply and decoupling network design requirements.

In one embodiment, the rows and associated memory regions scheduled for refresh are the rows that were not opportunistically refreshed prior to the opportunistic refresh interval ending. In FIG. 8B, memory addresses 813 indicate the memory addresses of rows within their associated memory regions in which to issue scheduled refreshes. Each row within a memory region is activated by an activate (ACT) command. Activate commands are issued to each group of different memory regions (e.g., 825A) after a time interval $t_{RR}$ that specifies the interval between two successive activate commands addressing the same bank. Each activated row is then precharged in response to a PRE command. The PRE command is issued by a time interval $t_{RAS}$ after the ACT command, such that the time interval $t_{RAS}$ specifies the interval between row access and data restoration (refresh).

As mentioned previously, each scheduled refresh command is received by the BRC associated with the bank in which the scheduled refresh command is directed. Accordingly, the BRC monitors which rows have been refreshed through opportunistic refreshes as well as scheduled refreshes. A counter (not shown) included in each BRC is incremented and outputs the next row to refresh to its associated bank RQ logic block. During the next scheduled refresh request period, the rows previously outputted to the bank RQ logic from its associated BRC are refreshed via a scheduled refresh transaction.

For example, row addresses 815 may indicate the rows that will be refreshed during the upcoming (i.e., the next) scheduled refresh request period. During the current scheduled refresh transaction, in Bank 0A, row address 0FF5 was refreshed thereby incrementing the counter in the BRC associated with Bank 0A. During the next scheduled refresh transaction, row address 0FF6 in Bank 0A will be refreshed.

When the scheduled refresh transaction is completed, the SCH_REF_DONE signal is asserted. The rising edge 817 of SCH_REF_DONE causes the REF_RQ signal to deassert 819 (i.e., go to logic low). The deassertion of REF_RQ causes the REF_GNT signal to also deassert 821. In one embodiment, the deassertion of REF_GNT also causes the SCH_REF_DONE signal to deassert 823. Referring back to FIG. 8A, as mentioned previously, the scheduled refresh request period for the scheduled refresh transaction expires shortly after the deassertion of the SCH_REF_DONE signal. Upon the next expiration of the scheduled refresh request timer, the RT control logic 701 then issues the next REF_RQ signal 803 requesting the next scheduled refresh transaction.

Referring back to FIG. 8A, the RT control logic 701 generates the ALL_ROWS_DONE signal to indicate that all the rows for each memory region have been refreshed either through opportunistic refresh or scheduled refresh. As described above, RT control logic 701 generates the ALL_ROWS_DONE signal when it detects that the NEXT_REF_ROW_ADDRESS for each memory region is at its maximum supported value. One simple method to perform this check and reduce the wire count is to enable each row address counter to include one extra bit and to perform an AND operation of the most significant bits from the NEXT_REF_ROW_ADDRESS signal received from each BRC. The refresh controller 615 then idles until the RT control logic 701 issues the next REF_START signal indicating the start of the next refresh period.

Figure 9:
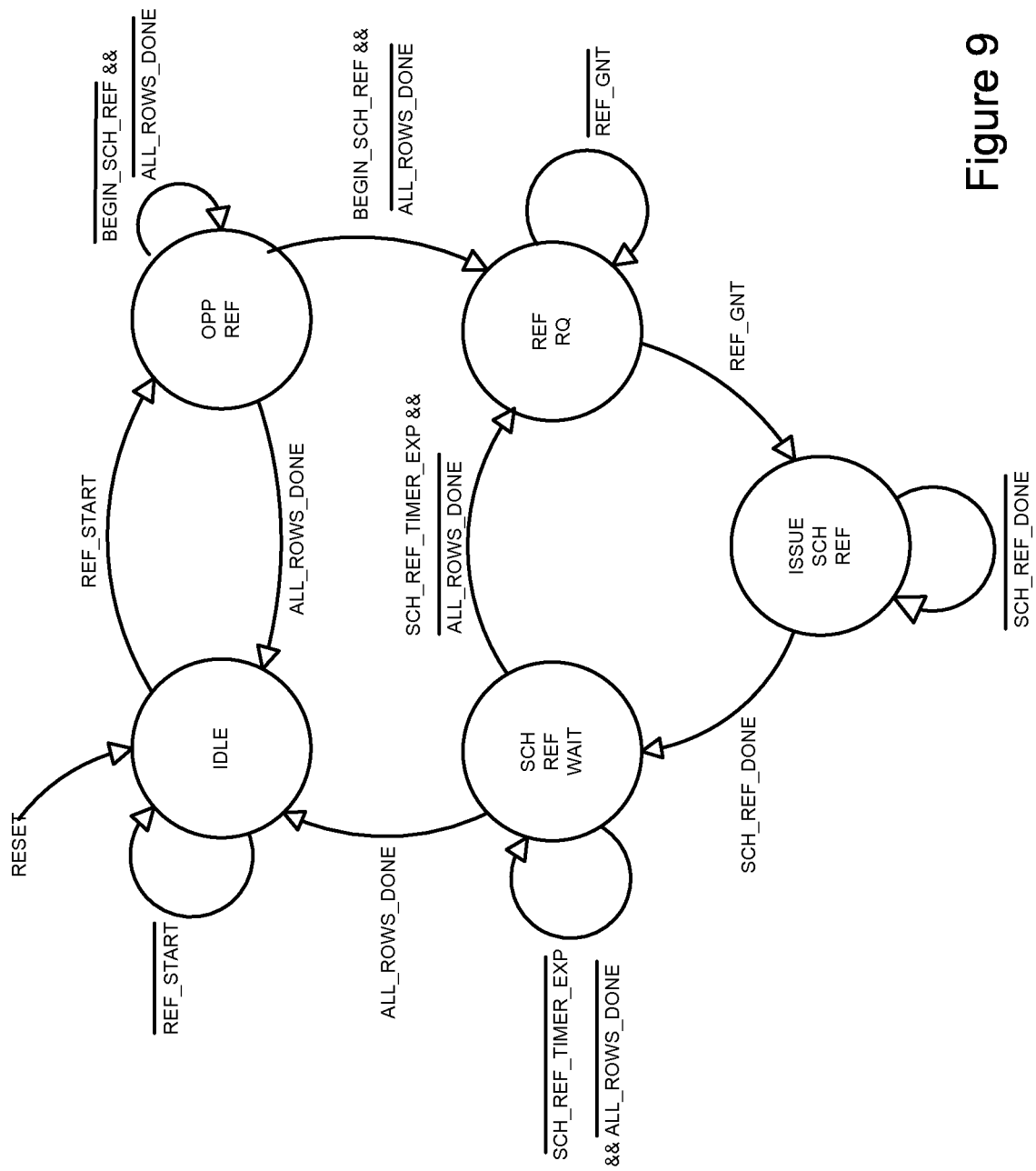
FIG. 9 illustrates a finite state machine for refresh timer control logic that is included in the refresh controller, according to one embodiment.

Referring now to FIG. 9, there is shown a state machine implemented by RT control logic 701 to issue the signals described above with reference to FIG. 7 through 8. In one embodiment, the opportunistic refresh state (OPP REF) indicates the period in which the refresh controller 615 issues opportunistic refreshes to memory regions of the memory module 603. The refresh request (REF_RQ) state indicates a period during the scheduled refresh interval where the refresh controller 615 requests for the host controller 601 to issue a scheduled refresh transaction. The issue scheduled refresh (ISSUE SCH REF) state describes the time period in which the refresh controller 615 issues a scheduled refresh transaction to the memory module 603. The scheduled refresh wait (SCH REF WAIT) state describes the state where the refresh controller 615 waits to issue another REF_RQ signal to the host controller 601. The IDLE state indicates the period where the refresh controller 615 idles until the host controller issues a REF_START signal to start a new refresh interval.

In one embodiment, the refresh controller outputs the REF_START signal indicating the beginning of a refresh interval. As described previously, the refresh interval includes an opportunistic refresh interval and a scheduled refresh interval. The opportunistic refresh interval lasts while the BEGIN_SCH_REF signal indicating the beginning of the scheduled refresh interval is not issued and all the rows of the entire memory module 603 including all memory regions have not been opportunistically refreshed ($\overline{ALL\_ROWS\_DONE}$). That is, the opportunistic refresh interval lasts while $\overline{BEGIN\_SCH\_REF}$ && $\overline{ALL\_ROWS\_DONE}$.

As mentioned previously, each BRC transmits the NEXT_REF_ROW_ADDRESS signal to the RT control logic 701. In one embodiment, the RT control logic 701 creates the ALL_ROWS_DONE signal by performing an AND operation with the most significant bit of the NEXT_REF_ROW_ADDRESS signal (for example, NEXT_REF_ROW_ADDRESS[12] bit if the NEXT_REF_ROW_ADDRESS is 13 bits in length ([12:0])) from each BRC, corresponding to $2^{12}$ or 4K addressable rows per memory region. In one embodiment, a logic high value resulting from the AND operation indicates that all the rows of the memory regions have been opportunistically refreshed whereas a logic low value indicates that there are rows that have yet to be refreshed.

If all rows of the entire memory module 603 have been opportunistically refreshed as indicated by the ALL_ROWS_DONE signal, the RT control logic 701 enters the idle state (IDLE) and remains idling until either a reset signal (RESET) is received from the host controller 601 or the next REF_START signal is issued. If the RT control logic 701 issues the BEGIN_SCH_REF signal and $\overline{\text{ALL\_ROWS\_DONE}}$ signal, the RT control logic 701 enters the REF_RQ state that transmits a REF_RQ to the host controller 601. That is, the RT control logic 701 requests that the host controller 601 issue a scheduled refresh transaction to refresh the rows that were not opportunistically refreshed during the opportunistic refresh interval. In response, the host controller 601 issues the scheduled refresh transaction to refresh the rows that were not opportunistically refreshed during the opportunistic refresh interval. The RT control logic 701 remains in the REF RQ state until a REF_GNT signal granting the scheduled refresh transaction is received from the host controller 601. When the RT control logic 701 receives the REF_GNT signal, it enters the ISSUE SCH REF state in which the RT control logic 701 communicates with the bank RQ logic module for each logical memory bank to transmit the scheduled refresh transactions to its associated memory banks. RT control logic 701 remains in ISSUE SCH REF state until the SCH_REF_DONE signal internal to the RT control logic 701 indicates the end of the time period allocated to complete the scheduled refresh transaction. When the SCH_REF_DONE signal is internally issued, the RT control logic 701 enters the SCH REF WAIT state in which it waits (i.e., idles) as long as the SCH_REF_TIMER_EXP and ALL_ROWS_DONE signals both remain deasserted. If all the rows are done being refreshed (ALLROWSDONE), RT control logic 701 again enters the IDLE state to idle until the next REF_START signal is issued signaling the next refresh interval.

On the other hand, if the scheduled refresh timer (internal to the RT control logic 701) expires (SCH_REF_TIMER_EXP), but all the rows have not been refreshed yet ($\overline{\text{ALL\_ROWS\_DONE}}$), the state machine re-enters the REF RQ state to issue another REF_RQ signal to the host controller 601 to issue another scheduled refresh transaction.

Bank Refresh Controller Architecture

Figure 10:
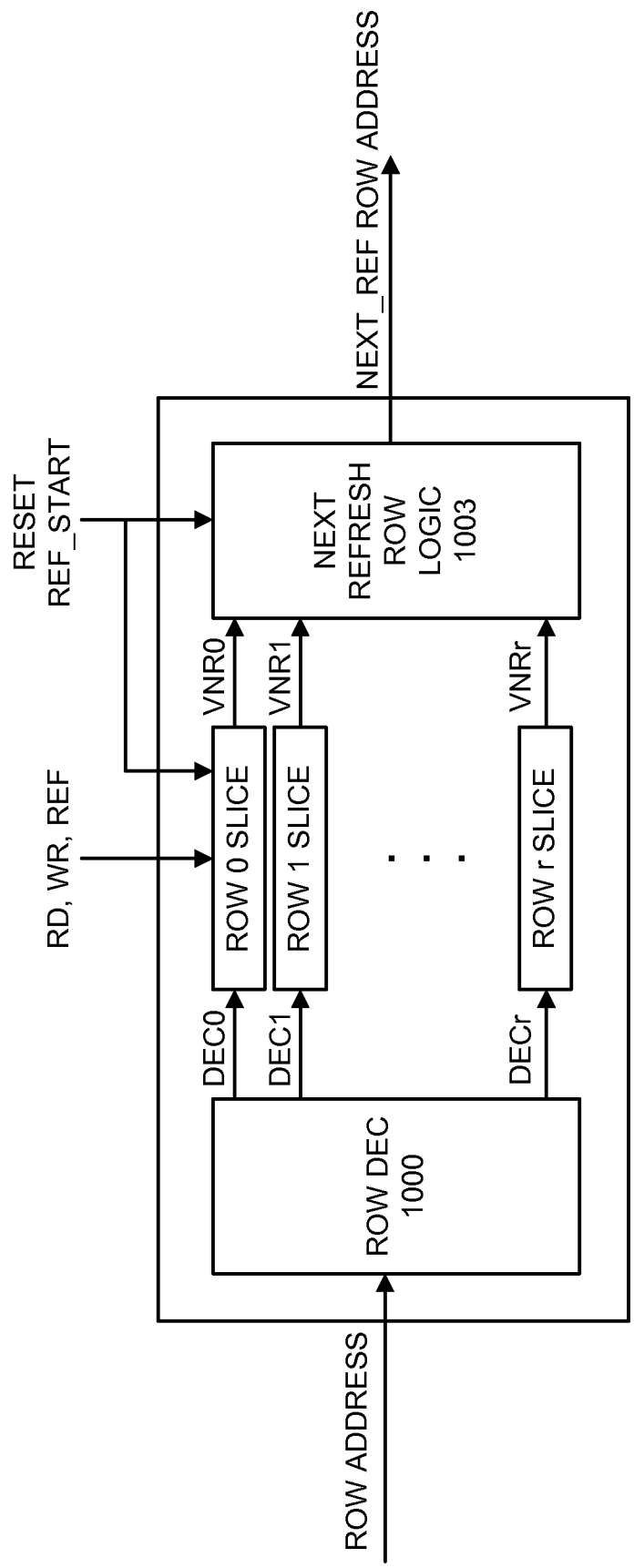
FIG. 10 illustrates a detailed view of a bank refresh controller, according to one embodiment.

Referring now to FIG. 10, there is shown one embodiment of the details of a BRC that is representative of one of Bank 0A BRC through Bank nB BRC illustrated in FIG. 7. Note that in other embodiments, different structures may be used for the BRC other than those shown herein.

In one embodiment, the BRC includes a row decoder 1000 and R row slices where R (R=r+1) is a positive integer and is equivalent to the number of rows within a memory region included in the memory module 603. That is, each row of a memory region has its own associated row slice according to one embodiment. As previously discussed, the BRC receives from the bank RQ logic a command (e.g., RD, WR, or REF) as well as a row address associated with the command. The row decoder 1000 receives the row address associated with the command from the bank RQ logic module associated with the BRC. The row decoder 1000 outputs a high decode (DEC) signal to a row slice associated with the row address responsive to a command being issued to that row and low DEC signals to the remaining row slices to deactivate their corresponding row slice.

In other words, a logic high DEC bit (e.g., one) is transmitted by the row decoder 1000 to its associated row slice indicating that a command was issued by the host controller 601 to the row associated with the slice. All other row slices receive a logic low DEC value (e.g., zero) indicating that the other rows have been deasserted. For example, in response to the host controller 601 issuing a read command directed towards row 0, row decoder 1000 issues a high DEC to Row 0 Slice and low DEC values to all other row slices in the BRC.

As previously mentioned, each row of a memory region has its own associated row slice. The row slice determines the status of its associated row. In one embodiment, the status of each row is either:

1) VNR=Row is valid and was not refreshed since the last refresh cycle

2) $\overline{\text{VNR}}$=Row is invalid or was refreshed since the last refresh cycle In other words, a VNR status indicates that the row comprises data (i.e., it is valid) and has not been refreshed since the last refresh cycle. The $\overline{\text{VNR}}$ status indicates that the row does not contain data or the row has been refreshed since the last refresh cycle.

In one embodiment, each row slice determines the status of its associated row based on the DEC value received from the row decoder 1000 as well as the command (e.g., RD, WR, or REF) received from its associated bank RQ logic. Each row slice comprises logic to determine the status of its row based on the values of DEC, RD, WR, and REF as will be described in further detail below. For example, row 0 slice receives a DEC value from row decoder 1000 and either a RD, WR, or REF command from bank 0 RQ logic. Receipt of a RD, WR, or REF command causes each row slice to output the state of its associated row. For example, row 0 slice outputs VNR0 indicative of the status of row 0.

Figure 11:
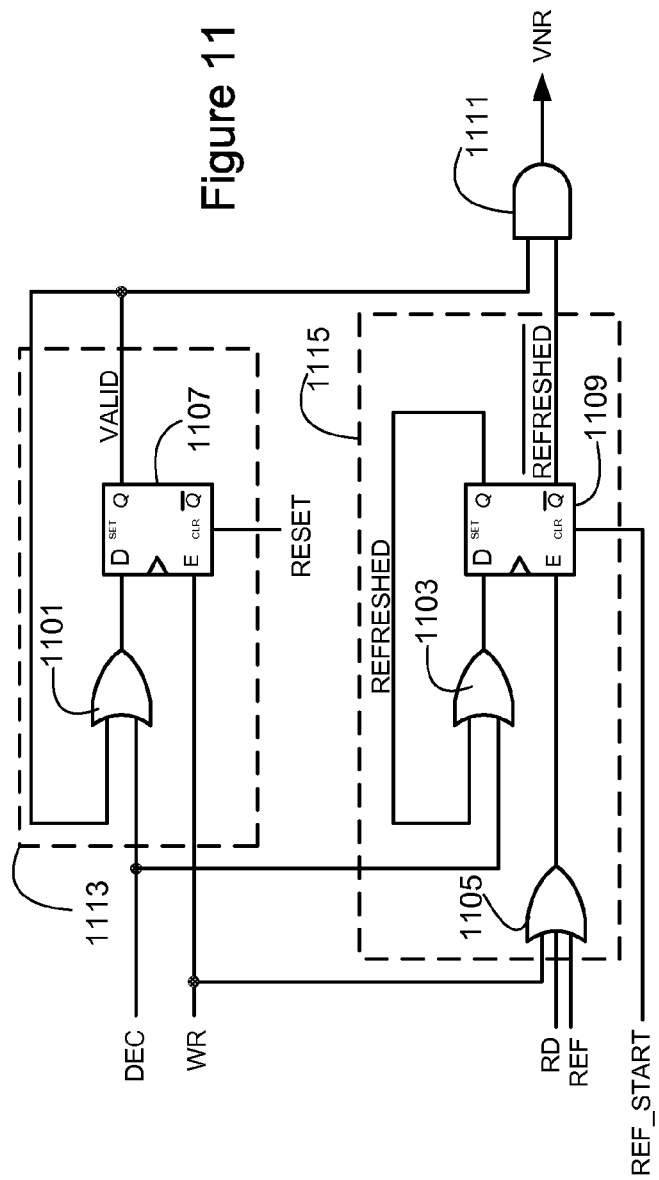
FIG. 11 illustrates a detailed view of a row slice of the bank refresh controller, according to one embodiment.

Referring now to FIG. 11, there is shown a detailed view of a row slice such as row slice 0 through row slice r, where r represents the number of addressable rows per memory region minus one. In one embodiment, each row slice is comprised of a logic structure illustrated in FIG. 11 including a pair of D flip-flops (with clear CLR and enable E input and Q output) 1107 and 1109, OR gates 1101, 1103, 1105, and an AND gate 1111. Note that in other embodiments, other logic structures may be used other than the structure illustrated in FIG. 11.

In one embodiment, logic stage 1113 determines whether a row is valid, and includes OR gate 1101 coupled to the D flip flop 1107. OR gate 1101 receives as input the DEC signal received from row decoder 1000 as well as the output (Q) of D flip flop 1107. Thus, the previous output of D-flip flop 1107 (Valid signal) is used as input for OR gate 1101 using feedback from D-flip flop 1107. The output of OR gate 1101 is inputted into the data input (D) of D-flip flop 1107. The output (Q) of D-flip flop 1107 is indicative of whether the row is valid or invalid (contains data). A logic high output (e.g., 1) of D-flip flop 1107 indicates that the row is valid (i.e., includes meaningful data) whereas a logic low output (e.g., 0) of D-flip flop 1107 indicates that the row is invalid (i.e., does not include meaningful data for it could include random data). In one embodiment, the clear input of D-flip flop 1107 receives the reset signal indicating the start of operation of the memory system (e.g., at power-on time).

The enable input of D flip flop 1107 is connected to the WR signal. Thus, when a WR command is issued to the row, a high logic value is received at the enable input of D-flip flop 1107. The high value received at the enable input causes D flip flop 1107 to propagate the value at the input (D) to the output (Q) of the D-flip fop. Responsive to a WR command not being issued to the row, a low logic value is received at the enable input of D-flip flop 1107. The low logic value causes D-flip flop 1107 to transmit the previous value of input (D) at output (Q).

In one embodiment, logic stage 1115 determines whether a row has been refreshed or not refreshed since the last refresh cycle, and includes OR gate 1105 and OR gate 1103 coupled to D-flip flop 1109. OR gate 1105 receives as its input WR, RD, and REF values. A command being issued to the row associated with the slice may one be one of a WR, RD, and REF command since only a single action is performed by the command. Thus, one of the WR, RD, and REF signals would be at logic high (e.g., 1 value) and the remaining signals would be at logic low (e.g., 0 value). However, note that all the values for WR, RD, and REF may also be at logic low if a command is not directed to the row.

The output of OR gate 1105 is inputted to the enable (E) input of D-flip flop 1109. Thus, a high value at the enable input causes the D-flip flop 1109 to propagate the input D to the output Q. In contrast, a low value at the enable input causes D-flip flop 1109 to output the previous input value. In one embodiment, the clear input of D-flip flop 1109 is coupled to the REF_START signal received from RT control logic 1101 indicating the refresh interval has begun. Responsive to receiving the REF_START signal, the value of D-flip flop 1109 is cleared indicating that the row has not yet been refreshed in this refresh interval.

In one embodiment, the data input (D) of D-flip flop 1109 is coupled to the output of OR gate 1103. The input of OR gate 1103 comprises the DEC signal as well as the previous output (Q) of D-flip flop 1109. In one embodiment, the output (Q) of D flip flop 1109 indicates whether the row has been refreshed and is used as part of a feedback loop for the input of OR gate 1103. As previously mentioned, the row decoder 1000 outputs a high decode (DEC) signal to a row slice associated with the row address responsive to a command being issued to that row. The row decoder 1000 outputs low DEC signals to the remaining row slices to deactivate their corresponding row slice. If the row receives a command (e.g., WR, RD, or REF), the DEC value is a high value indicating that the row is currently being addressed. The first time (after a REF_START) that a particular row is accessed via either a WR, RD, or REF command, the REFRESHED bit for that row will be asserted, and it will remain asserted until the next REF_START pulse clears its state. A WR or RD command intrinsically refreshes the row whereas a received REF command indicates that the row was refreshed via either an opportunistic refresh or a scheduled refresh. However, if the row does not receive a command, the DEC value is a low value, and the REFRESHED bit will remain deasserted (until a subsequent scheduled refresh operation forces the row to be refreshed).

In one embodiment, the inputs of AND gate 1111 include the output (Q) of D-flip flop 1107 (i.e., the Valid signal) and the inverted output ($\overline{Q}$) of D-flip flop 1109. Thus, the output of AND gate 1111 becomes the VNR signal (meaning Valid and Not Refreshed). Consider the scenario where the output (Q) of D-flip flop 1107 is a high value indicating that the row is valid and the output (Q) of D-flip flop 1109 is a low value indicating that the row is not refreshed since the last REF_START. Thus, the input of AND gate 1111 receives the inverted output ($\overline{Q}$) of D-flip flop 1109 and the VALID signal both at logic high. Thus, in this example, the row status is VNR (e.g. logic high value) indicating that the row is valid and was not refreshed since the beginning of the last refresh interval.

However, if the output (Q) of D-flip flop 1107 is a logic low value indicating that the row is invalid or the output (Q) of D-flip flop 1109 is a logic high value indicating that the row was refreshed, the output of AND gate 1111 would be at logic low, indicating that the row is either invalid or has been refreshed since the last refresh cycle.

Referring back to FIG. 10, each row slice outputs the row status (VNR or $\overline{VNR}$) to the next refresh row logic 1003. The next refresh row logic 1003 determines the next row in which to perform a refresh (NEXT_REF_ROW_ADDRESS). As described previously, the NEXT_REF_ROW_ADDRESS may be used to determine the next row in which to issue an opportunistic refresh during the opportunistic refresh interval or may be used to determine the next row in which to issue a scheduled refresh during the scheduled refresh interval.

Furthermore, the Bank Refresh Controller (BRC) tracks invalid rows as well as rows that have been refreshed. By tracking which rows are invalid and which rows that have been refreshed, the refresh controller 615 avoids issuing unnecessary refreshes that result in excess power consumption. In one embodiment, the next refresh row logic 1003 outputs the next row on which to perform a refresh to the bank RQ logic which can issue the refresh to the appropriate memory region. Thus, during the opportunistic refresh interval, the bank RQ logic issues an opportunistic refresh to the row indicated by the NEXT_REF_ROW_ADDRESS. However, during the scheduled refresh interval, the bank RQ logic issues a scheduled refresh transaction when granted by the host controller 601 to the row indicated in NEXT_REF_ROW_ADDRESS.

Figure 12:
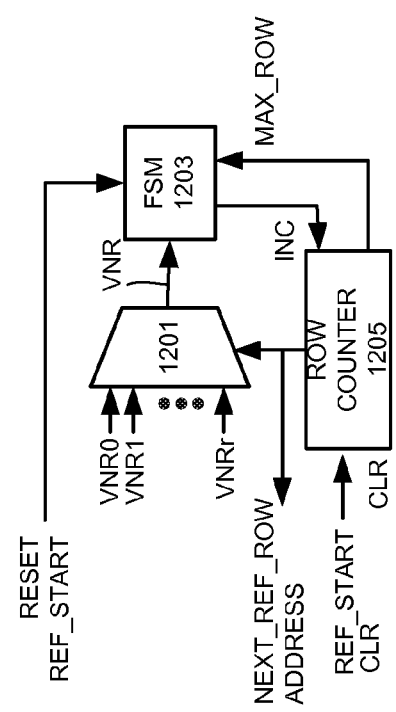
FIG. 12 illustrates a detailed view of the next row logic of the bank refresh controller, according to one embodiment.

Referring now to FIG. 12, there is shown one embodiment of the detailed view of the next refresh row logic 1003. The next refresh row logic 1003 comprises a multiplexer (MUX) 1201, a finite state machine (FSM) 1203 and a row counter 1205. Note that in other embodiments, the next refresh row logic 1003 may comprise other components other than those shown in FIG. 12.

In one embodiment, MUX 1201 receives the status of each row (VNR0 through VNRr) from the row slices included in the BRC. The MUX 1201 transmits the VNR bit of the selected row to the FSM 1203 based on a decode of the NEXT_REF_ROW_ADDRESS output from row counter 1205. Row counter 1205 is incremented when it receives the INC output of the FSM 1203. Accordingly, the MUX 1201 outputs the status of the current row to FSM 1203, the logic of which will be described in further detail below. For example, if FSM 1203 increments row counter 1205 such that the current row is row 500, MUX 1201 selects the row status for row 500 (e.g., VNR 500) and outputs the row status to FSM 1203. Furthermore, responsive to the row counter 1205 being incremented, the row counter 1205 outputs to the bank RQ logic the row address (NEXT_REF_ROW_ADDRESS) of the next row to refresh.

As described previously, a refreshed bit is set by the row slice logic in the BRC in response to data access commands or refreshes commands. These "valid" and "refreshed" bits are combined within the row slice logic to produce the "valid and not refreshed" output (VNR). In one embodiment, the row counter 1205 transmits the NEXT_REF_ROW_ADDRESS to the bank RQ logic based on the values of the "refreshed" and "valid" bits for each row. The FSM 1203 skips rows that have been refreshed and rows that are invalid by simply issuing an increment (INC) command to the row counter 1205. By skipping these rows, the FSM 1203 prevents the bank RQ logic from issuing unnecessary refresh commands. The refreshed bits in the slices of the bank refresh controller are cleared upon a new refresh interval indicated by the signal REF_START.

Additionally, in one embodiment the row counter 1205 also tracks whether the next row to refresh is the last row in the memory region. When the row counter 1205 has reached its maximum value (for example, 0x0FFF in the case of a 12-bit row address) and it receives an INC signal from FSM 1203, it will output the MAX_ROW signal back to FSM 1203, indicating that all rows have been refreshed. When FSM 1203 detects the MAX_ROW input, it will transition to the IDLE state and will wait for the next assertion of the REF_START signal, indicating the start of a new refresh interval.

Figure 13:
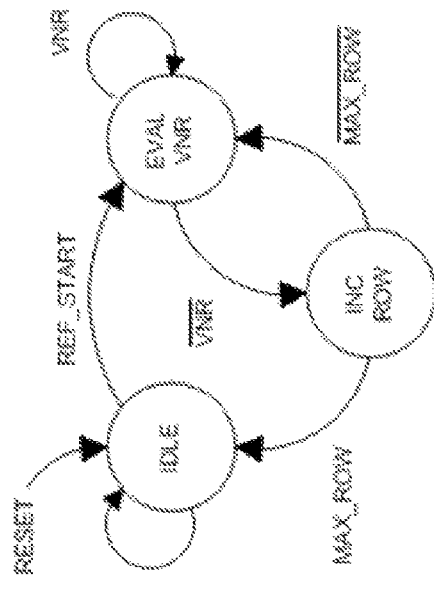
FIG. 13 illustrates a finite state machine of the next row logic, according to one embodiment.

Referring now to FIG. 13, there is shown one embodiment of the FSM 1203. In one embodiment, the FSM 1203 receives as input the current row status (e.g., VNR for the selected row) from MUX 1201, the start of a refresh cycle (REF_START), a reset signal (RESET), and the MAX_ROW signal from row counter 1205. In one embodiment, the FSM 1203 enters the IDLE state upon sampling a RESET input, and remains in the IDLE state until the REF_START signal is received indicating that a new refresh cycle has begun. Receiving the REF_START signal causes the FSM 1203 to enter the EVAL VNR state.

The FSM 1203 receives the row VNR status from MUX 1201 and evaluates the status of the row in the EVAL VNR state. Responsive to the row status indicating that the row is invalid or has been refreshed since the last refresh cycle ($\overline{VNR}$), the FSM 1203 issues a command to the row counter 1205 to increment the counter that generates the NEXT_REF_ROW_ADDRESS corresponding to the next row address. Thus, the row that is invalid or has been refreshed is skipped since its row address is not outputted to the bank RQ logic to issue a refresh to that row. If the row status indicates that the row is valid and not refreshed since the last REF_START, the FSM 1203 remains in the EVAL VNR state waiting for the current row to be either intrinsically refreshed (via a WR or RD command to that row), opportunistically refreshed (due to a WR or RD command to the opposing memory region of the same logical bank), or refreshed via a scheduled refresh. When any of these actions occur, the VNR bit for the current row will be cleared, causing the FSM 1203 to transition to the INC_ROW state, where the row counter 1205 will be incremented.

As mentioned above, the FSM 1203 also receives from row counter 1205 a status bit indicating whether the last row of the memory bank has been reached (MAX_ROW) or not reached ($\overline{MAX\_ROW}$). If the last row is reached, the FSM 1203 enters the IDLE state and remains idle until the next refresh cycle begins. However, if the last row is not reached, the FSM evaluates the next row status received from MUX 1201.

Opportunistic Refresh Scheduling

Figure 14A:
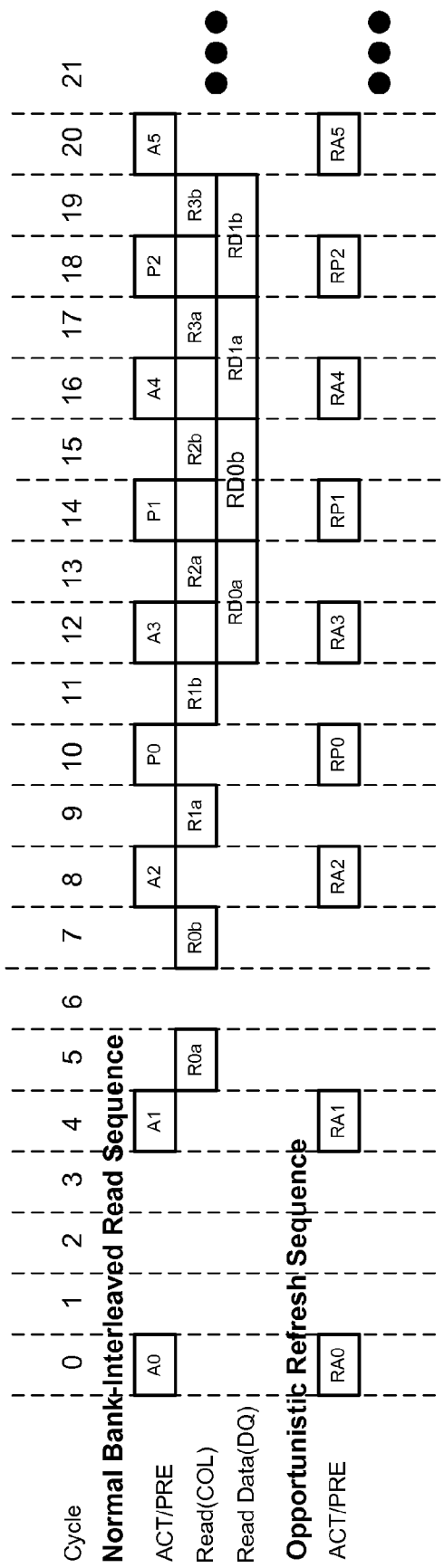
FIGS. 14A and 14B illustrate timing diagrams of opportunistic refresh scheduling during read and write operations, respectively, according to one embodiment.
Figure 14B:
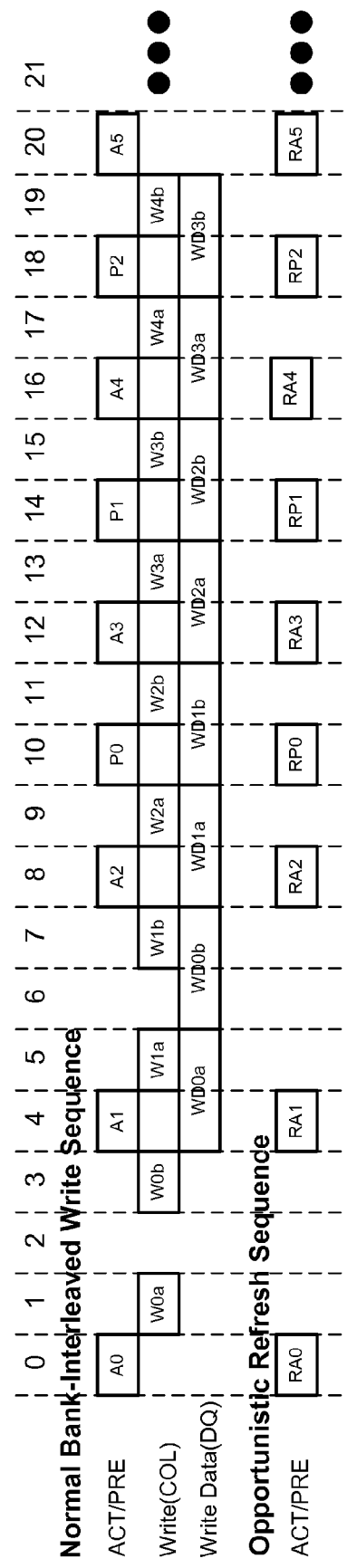

Referring now to FIGS. 14A and 14B, there are shown embodiments for scheduling opportunistic refreshes during bank-interleaved read sequences and bank-interleaved write sequences, respectively. Each command illustrated in FIGS. 14A and 14B corresponds to a specific timing cycle illustrated in the figures. Note that in other embodiments, other scheduling schemes may be implemented and that FIG. 14A and FIG. 14B are described with respect to the memory embodiment illustrated in FIG. 1B. FIGS. 14A and 14B include various acronyms which are defined as follows according to one embodiment:

An: Activate command to Bank n to open a wordline in Bank n;
Pn: Precharge command to Bank n to close the activated wordline and prepare the bank for the next access, if any;
RAn: Refresh activate command to Bank n to refresh a row in Bank n;
RPn: Refresh precharge command to Bank n to precharge a refreshed row in Bank n;
Rna: First read command to Bank n;
Rnb: Second read command to Bank n;
RDna: First read data accessed from Bank n in response to read command Rna
RDnb: Second read data accessed from Bank n in response to read command Rnb;
Wna: First write command to Bank n;
Wnb: Second write command to Bank n;
WDna: First write data, associated with write command Wna, to store in Bank n; and
WDnb: Second write data, associated with write command Wnb, to store in Bank n.

Referring now to FIG. 14A, an embodiment of opportunistic refresh scheduling performed by the buffer 609 during normal bank-interleaved read sequences to eight memory banks is illustrated. In one embodiment, two columns are accessed per row during a read sequence directed to a memory bank with a row in the opposing half bank being opportunistically refreshed simultaneous with the read sequence. The opportunistic refresh scheduling may be applicable to the various memory architectures described above. However, for exemplary purposes, opportunistic refresh scheduling is described with respect to the embodiment illustrated in FIG. 1 where opportunistic refreshes are issued to an opposing memory region of each memory bank.

In one embodiment, buffer 609 issues an activate command (A0) to open a first row in a first memory bank. The first memory bank comprises a first and second memory region. In response to the activate command (A0) the first row in the first memory region of the first memory bank is activated. Concurrently with the first activate command, buffer 609 substantially simultaneously issues a first refresh activate command (RA0) to open a first row in the second memory region of the memory bank. Once the first row of the first memory region has been activated, buffer 609 issues a first read command (R0a) and a second read command (R0b) to the first memory region that corresponds to the activate command. Buffer 609 then issues a precharge command (P0) directed to the first row in the first memory region while simultaneously transmitting a first refresh precharge command (RP0) to the first row in the second memory region. Buffer 609 then receives read data (RD0a) and data (RD0b) accessed from the first memory region.

Note that buffer 609 also issues a second activate command (A1) to open a first row in a second memory bank, a third activate command (A2) to open a first row in a third memory bank, etc. where each memory bank also comprises a first and second memory region. Thus, buffer 609 interleaves read sequences to other memory banks in the memory module while concurrently performing opportunistic refreshes to a second wordline in the opposing memory region of each memory bank. For example, concurrently with the second activate command to a first region of the second memory bank, buffer 609 substantially simultaneously issues a second refresh activate command (RA1) to open a second row in the opposing second memory region of the second memory bank. Accordingly, buffer 609 issues a precharge command (P1) to the second row in the first memory region of the second memory bank while substantially simultaneously transmitting a second refresh precharge command (RP1) to the second row in the opposing second memory region of the second memory bank. This process repeats itself until an activate command is issued to each of the eight memory banks of the (memory devices of the) memory module that causes the opposing half bank to be opportunistically refreshed.

Referring now to FIG. 14B, an embodiment of opportunistic refresh scheduling performed by the buffer 609 during normal bank-interleaved write sequences to eight memory banks is illustrated. In one embodiment, two columns are accessed per row during a write sequence of a memory bank with a row in an opposing memory region being opportunistically refreshed. Similar to FIG. 14A, each memory bank comprises a first and second memory region. Responsive to an activate command being directed to the first memory region, a refresh activate is issued to the second memory region and vice versa. The opportunistic refresh scheduling may be applicable to the various memory architectures described above. However, for exemplary purposes, opportunistic refresh scheduling is described with respect to the embodiment illustrated in FIG. 1 where opportunistic refreshes are issued to an opposing memory region of a memory device.

In one embodiment, buffer 609 issues a first activate command (A0) to open a first row in a first memory bank. The first memory bank comprises a first and second memory region as mentioned above. The activate command (A0) opens the first row in the first memory region of the first memory bank. Concurrently with the first activate command, buffer 609 simultaneously issues a first opportunistic refresh activate command (RA0) to open a first row in the second memory region of the bank. Responsive to receiving the activate commands, rows are opened. Buffer 609 then issues a first write command (W0a) directed to a first column address in the first row of the first memory region. A second write command (W0b) is issued to a second column address in the first row of the first memory region by buffer 609. The buffer 609 then writes data (WD0a) to the first column address in the first row and also writes data (WD0b) to the second column address in the first row of the first memory region. Buffer 609 then issues a precharge command (P0) to the row in the first memory region while simultaneously transmitting a refresh precharge command (RP0) to the row in the second memory region.

Note that buffer 609 also issues a second activate command (A1) to open a first row in a second memory bank, a third activate command (A2) to open a first row in a third memory bank, etc. where each memory bank also comprises a first and second memory region. Thus, buffer 609 interleaves write sequences to other memory banks while concurrently performing opportunistic refreshes to a second row in the opposing memory region of each memory bank. For example, concurrently with the second activate command to the first row in the second memory bank, buffer 609 substantially simultaneously issues a second refresh activate command (RA1) to open a second row in the second memory region of the second memory bank. Accordingly, buffer 609 issues a precharge command (P1) to the first row in the first memory region of the second bank while substantially simultaneously transmitting a second refresh precharge command (RP1) to the second row in the second memory region of the second bank. This process repeats itself until a activate command is issued to each of the eight memory banks that causes the opposing half bank to be opportunistically refreshed.

Alternative Memory System Architecture

Figure 15:
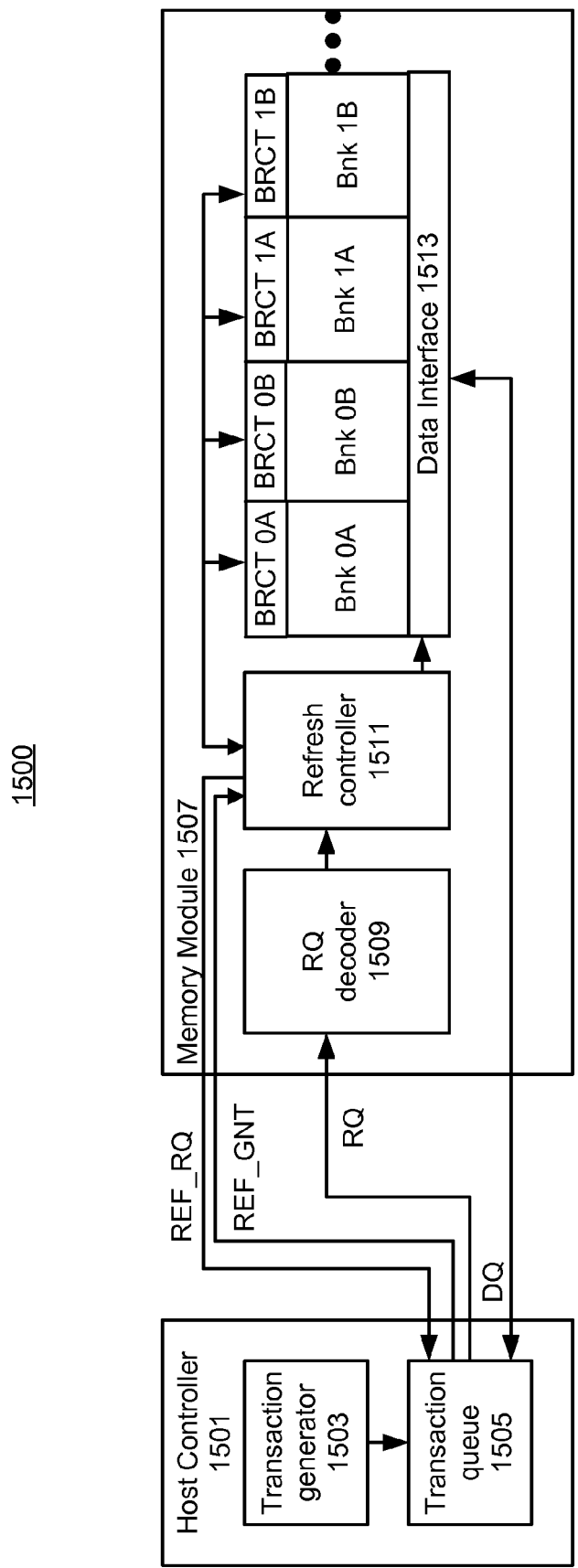
FIG. 15 illustrates a memory system in which a refresh is performed in a single DRAM, according to another embodiment.

Referring now to FIG. 15, there is shown one embodiment of an alternative memory system 1500 for performing opportunistic refreshes concurrently with normal activation of rows in memory regions of a memory module. System 1500 supports opportunistic refreshing of memory regions described in the memory modules previously described in FIGS. 1 through 5. Note that other memory architectures other than those described herein may be used for implementation of the functionality described herein.

Memory system 1500 comprises a host controller 1501 and a memory module 1507 comprising a single DRAM. Memory system 1507 is similar to memory system 600 illustrated in FIG. 6. However, rather than comprising a DRAM stack, memory system 1500 comprises a single DRAM. The functionality of the host controller 1501, request (RQ) decoder 1509, and data interface 1513 are similar to the host controller 601, request decoder 613, and data interface 621 illustrated in FIG. 6, respectively. Thus, the description for the host controller 1501, request (RQ) decoder 1509, and data interface 1513 will be omitted for brevity.

Refresh controller 1511 of system 1500 is also similar to refresh controller 615 of system 600. However, in system 1500, rather than comprising a BRC within the refresh controller 615 for each memory region (e.g., Bnk 0A, Bnk 0b, Bnk 1A, Bnk 1B, etc.) as illustrated in FIG. 6, a simple counter is used for each memory region. As shown in FIG. 12, in one embodiment, a bank refresh counter (BRCT) is coupled to each memory region rather than being integrated within the refresh controller 1511.

Figure 16:
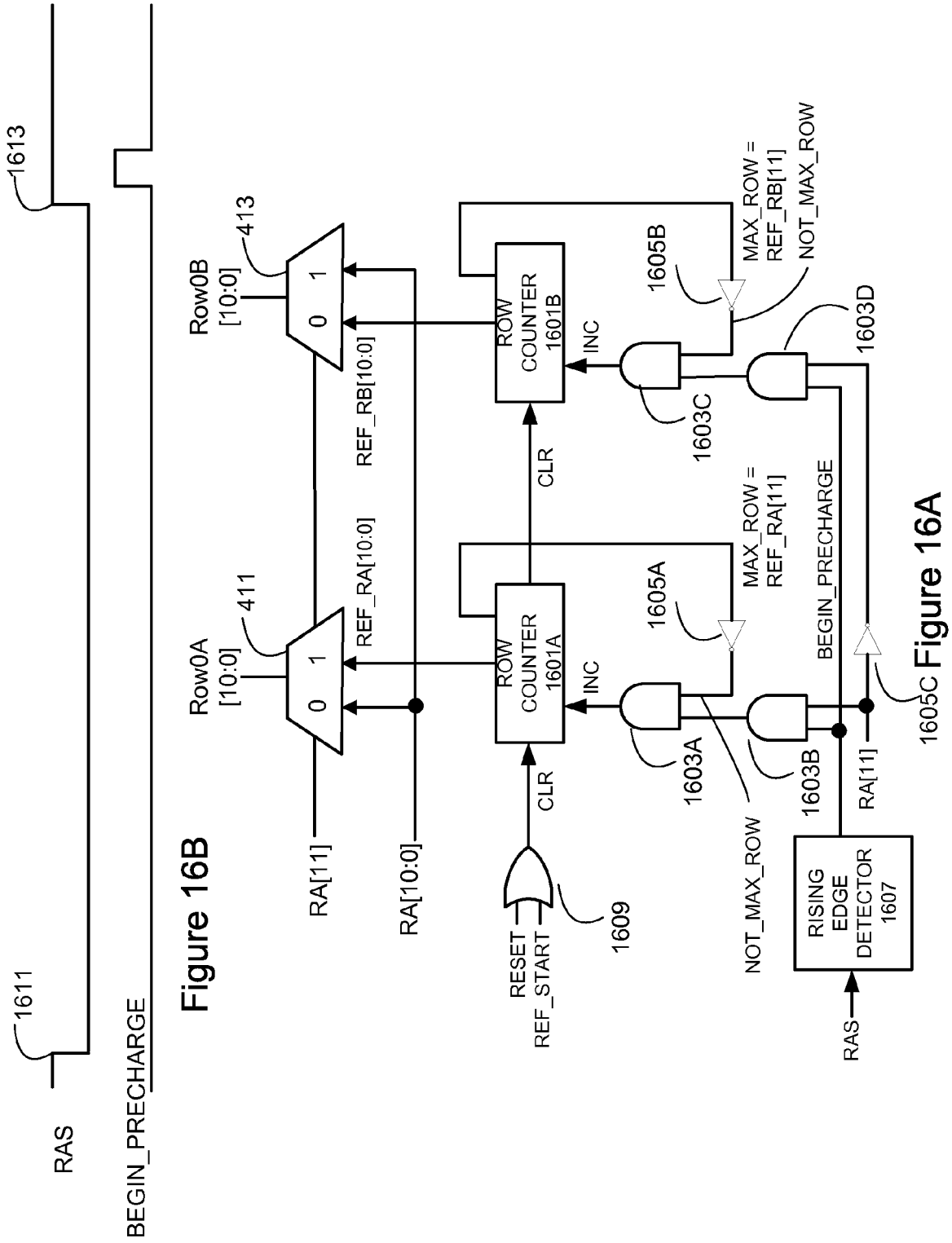
FIGS. 16A and 16B illustrate how the bank refresh counter performs refresh in the single DRAM, according to one embodiment.

Referring now to FIG. 16A, there is shown a detailed view of a BRCT of FIG. 15. Note that the following discussion is an expansion of the discussion of C/A block 205 illustrated in FIG. 4B. Thus, FIG. 16A assumes the memory configuration illustrated in FIG. 4A. However, a similar structure for the BRCT may be used with additional or fewer components than those illustrated in FIG. 16A for the different memory configurations discussed herein.

In one embodiment, each BRCT comprises row counters 1601. Row counters 1601 perform similar functionality as row counter 1205 illustrated in FIG. 12. Thus, the functionality of row counters 1601 is omitted for brevity. The clear input (CLR) of the row counters 1601 is coupled to the output of OR gate 1609. The inputs of OR gate 1609 are the RESET and REF_START signals. Thus, at the start of a refresh interval, a high REF_START signal is received by OR gate 1609 causing the contents of the row counters 1601 to be cleared. Likewise, if a RESET signal is received, the contents of the row counters are cleared. By clearing the row counters 1601, the first row in Bank 0A and Bank 0B are opportunistically refreshed responsive to a first activate command directed to each bank.

Row counter 1601A transmits a row address (REF_RA[10:0]) of a row to opportunistically refresh to MUX 411 included in C/A block 205. Row counter 1601B similarly transmits a row address (REF_RB[10:0]) of a row to opportunistically refresh to MUX 413 included in C/A block 205 as described with respect to FIG. 4B. The operation of MUXs 411 and 413 are described above with respect to FIG. 4B and are omitted for brevity purposes. To determine which row address to transmit to their respective MUX, each row counter 1601 receives an increment (INC) signal that increments the row counter 1601. The generation of the INC signal is described below.

Each row counter 1601 is coupled to a series of logic gates and a rising edge detector 1607 which are used to generate the INC signal. The rising edge detector 1607 detects a rising edge of a row address strobe (RAS) signal. Responsive to detecting the rising edge of the RAS signal, the rising edge detector 1608 outputs a signal (BEGIN_PRECHARGE) to issue a precharge command.

Referring now to FIG. 16B, a RAS signal and BEGIN_PRECHARGE signal is illustrated. The falling edge 1611 of the RAS signal indicates the start of the activate operation and rising edge 1613 indicates the start of a precharge operation. The rising edge detector 1607 outputs the BEGIN_PRECHARGE signal responsive to detecting rising edge 1613.

Referring back to FIG. 16A, the BEGIN_PRECHARGE signal is inputted into AND gate 1603B. RA[11] is also inputted into AND gate 1603B. As described with respect to FIG.

4B, RA[11] controls which memory region is activated in memory bank 400 for a memory access. Responsive to a high BEGIN_PRECHARGE signal being issued (i.e., a 1 value) and RA[11] also being high, AND gate 1603B outputs a high value to the input of AND gate 1603A. However, if a low RA[11] value or a low BEGIN_PRECHARGE signal is received by AND gate 1603B, a low value is transmitted to AND gate 1603A which causes a low INC signal. The low INC signal causes row counter 1601A to remain in its current state.

The other input of AND gate 1603A is connected to the inverted MAX_ROW signal indicating whether the row counter 1601A has reached the last row of memory bank 0A. If the max row is not reached, the row counter 1601A outputs a low MAX_ROW value (i.e., a 0 value) which is inverted by inverter 1605A causing a high NOT_MAX_ROW value. Thus, with two high inputs, AND gate 1603A issues a high INC signal to row counter 1601A. The high INC signal causes row counter 1601A to increment and output the address of the row to opportunistically refresh (i.e., REF_RA[10:0]). However, if the max row is reached, the row counter 1601A outputs a high MAX_ROW signal, which propagates as a low NOT_MAX_ROW to AND gate 1603A. The low NOT_MAX_ROW value causes a low INC signal to be outputted by the AND gate 1603A to row counter 1601A. Accordingly, the row counter 1601A is not incremented.

The BEGIN_PRECHARGE signal is also inputted to AND gate 1603D. The other input of AND gate 1603D is the inverted RA[11] signal. RA[11] is inverted by inverter 1605C. If RA[11] is high, a low RA[11] value is inputted to AND gate 1603D. Thus, AND gate 1603D outputs a low value to AND gate 1603C which in turn outputs a low INC signal to row counter 1601B. Thus, a high RA[11] value causes row counter 1601B to remain in its current state. However, responsive to a low RA[11], inverter 1605 inverts the signal so that a high RA[11] is received at AND gate 1603D. If BEGIN_PRECHARGE is also high, AND gate 1603D outputs a high value to AND gate 1603C.

Similar to row counter 1601A, row counter 1601B outputs a MAX_ROW signal indicating whether the last row of Bank 0B has been reached. If the max row is not reached, the row counter 1601B outputs a low MAX_ROW value (i.e., a 0 value) which is inverted by inverter 1605B. Thus, with two high inputs, AND gate 1603C issues a high INC signal to row counter 1601B. The high INC signal causes row counter 1601B to increment and output the row to opportunistically refresh (i.e., REF_RB[10:0]). However, if the max row is reached, the row counter 1601B outputs a high MAX_ROW signal, which propagates as a low NOT_MAX_ROW to AND gate 1603C. The low NOT_MAX_ROW value causes a low INC signal to be outputted by AND gate 1603C to row counter 1601B. Accordingly, the row counter 1601B is not incremented.

Figure 17:
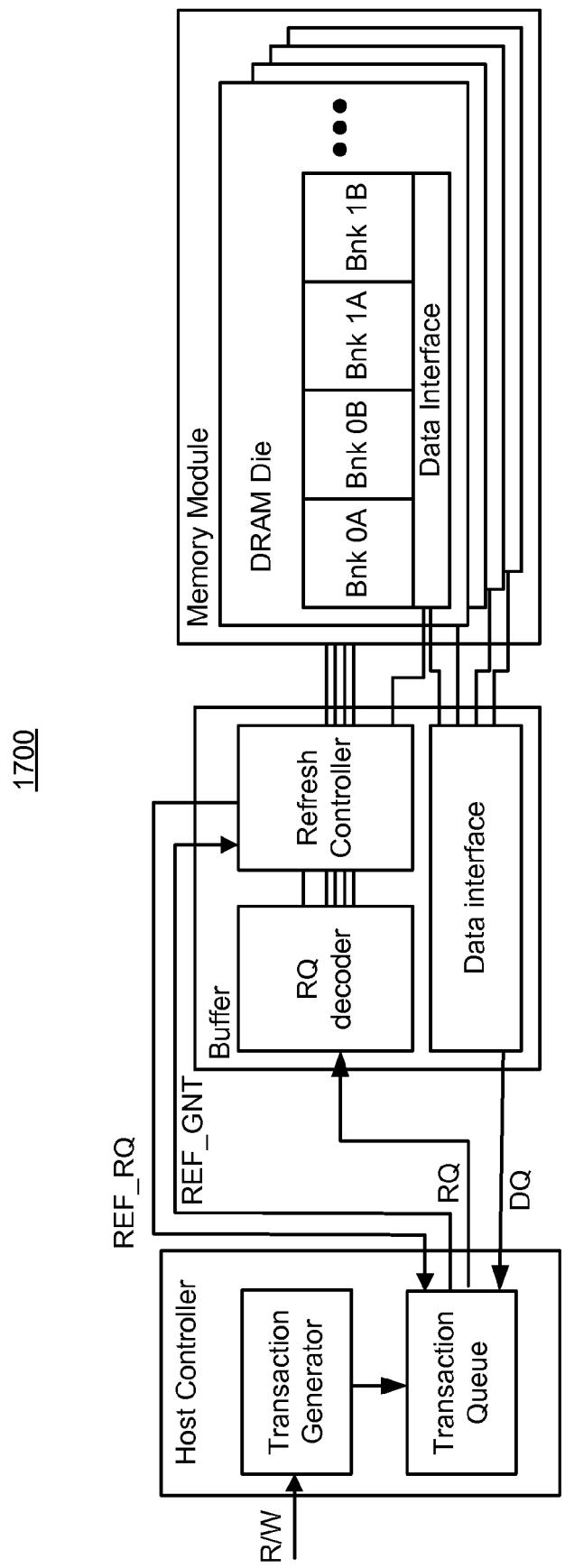
FIG. 17 illustrates a memory system including a refresh controller included in a buffer according to another embodiment.

Referring now to FIG. 17, the host controller functionally described above with respect to refresh operations can be implemented in a buffer device separate from the memory module 603. The functionality of the buffer device in FIG. 17 is similar to the discussion of buffer 609 so is omitted for brevity. Additionally, the buffer device can be coupled to a memory module comprising a number of DRAMs in a stacked configuration as shown in FIG. 17 or a single DRAM.

Upon reading this disclosure, those of ordinary skill in the art will appreciate still additional alternative structural and functional designs for performing opportunistic refreshes on memory devices, through the disclosed principles of the present disclosure. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure disclosed herein without departing from the spirit and scope of the disclosure as defined in the appended claims.

What is claimed is:

1. An integrated circuit device that controls a memory device, the integrated circuit device comprising:
  a circuit configured to:
    receive an activate command and a data access command; and
    responsive to receiving the activate command and the data access command, provide:
      a bank address, wherein the bank address identifies a bank of a plurality of banks in a memory device;
      a first row address that identifies a first row within the bank of the memory device for a memory access; and
      a second row address that identifies a second row within the bank of the memory device to perform a refresh operation; and
  a command interface coupled to the circuit, the command interface configured to output the bank address, the first row address, and the second row address provided by the circuit to the memory device, wherein the first row address and the second row address are simultaneously output to the memory device.

2. The integrated circuit device of claim 1, wherein the first row address identifies the first row within a first memory portion of the bank and the second row address identifies the second row within a second memory portion of the bank.

3. The integrated circuit device of claim 1, wherein the first row address identifies the first row that is included in one of a first, second, third, and fourth memory portions of the bank, and the second row address identifies the second row that is included in a remaining one other than said one of the first, second, third, and fourth memory portions of the bank.

4. The integrated circuit device of claim 1, wherein the circuit further provides a third row address that identifies a third row within the bank of the memory device to perform a refresh operation and the interface outputs the third row address to the memory device while the memory device is not being accessed.

5. The integrated circuit device of claim 4, wherein:
  the circuit provides the second row address during a first refresh interval; and
  the circuit provides the third row address during a second refresh interval subsequent to the first refresh interval.

6. The integrated circuit device of claim 5, wherein the third row identified by the third row address is not refreshed during the first refresh interval.

7. A memory module comprising:
  a memory device including a plurality of banks, each bank of the plurality of banks having a plurality of storage cells;
  a circuit configured to:
    receive an activate command and a data access command; and
    responsive to receiving the activate command and the data access command, provide:
      a bank address, wherein the bank address identifies a bank of the plurality of banks;
      a first row address that identifies a first row of memory cells within the bank for a memory access; and a second row address that identifies a second row of memory cells within the bank to perform a refresh operation;
a command interface coupled to the circuit, the command interface configured to output the bank address, the first row address, and the second row address provided by the circuit;
a data interface coupled between the plurality of the banks and the command interface, the data interface configured to receive the bank address, the first row address, and the second row address from the command interface;
a first plurality of sense amplifiers to sense, in response to the bank address and the first row address, the first row of memory cells in the bank; and
a second plurality of sense amplifiers to refresh the second row of memory cells in the bank based on the second row address, wherein the second plurality of sense amplifiers refreshes the second row of memory cells concurrently with the first plurality of sense amplifiers sensing the first row of memory cells.

8. The memory module of claim 7, wherein
the circuit generates a second activate command specifying the second row address.

9. The memory module of claim 8, wherein the circuit generates a third activate command specifying a third row address of memory cells to refresh responsive to receiving the activate command.

10. The memory module of claim 8, wherein the activate command addresses the first row of memory cells that is included in one of a first, second, third, and fourth memory portions of the bank, and the second activate command addresses the second row of memory cells that is included in a remaining one other than said one of the first, second, third, and fourth memory portions of the bank.

11. The memory module of claim 7,
wherein the first row of memory cells is included in a first memory portion of the bank and the second row of memory cells is included a second memory portion of the bank.

12. The memory module of claim 11, further comprising:
a first row decoder coupled to the first memory portion and to activate the first row of memory cells based on the first row address; and
a second row decoder coupled to the second memory portion and to activate the second row of memory cells based on the second row address.

13. The memory module of claim 12, wherein the first row decoder and the second row decoder comprise full row decoders.

14. The memory module of claim 7, wherein the first row of memory cells in the bank and the second row of memory cells in the bank are portions of a single row of memory cells of the bank.

15. A method of operation in a memory module comprising a memory device including a plurality of banks, the method comprising:
receiving an activate command and a data access command;
responsive to receiving the activate command and the data access command, determining a bank address that identifies a bank of the plurality of banks, a first row address that identifies a first row of memory cells within the bank for a memory access, and a second row address that identifies a second row of memory cells within the bank to perform a refresh operation;
sensing, by a first plurality of sense amplifiers included in the memory module, a first row of memory cells in the bank based on the bank address and the first row address; and
refreshing, by a second plurality of sense amplifiers included in the memory module, a second row of memory cells in the bank concurrently with the first row of memory cells being sensed by the first plurality of sense amplifiers, the second row of memory cells refreshed based on the bank address and the second row address.

16. The method of claim 15, further comprising:
receiving a first activate command specifying a first memory address associated with the first row of memory cells; and
generating a second activate command specifying a second memory address associated with the second row of memory cells responsive to receiving the first activate command.

17. The method of claim 15, further comprising:
refreshing a third row of memory cells in the predetermined bank while data from memory cells in the predetermined bank are not being accessed.

* * * * *